(12) United States Patent
Watanabe et al.

(10) Patent No.: US 12,260,838 B2
(45) Date of Patent: Mar. 25, 2025

(54) DISPLAY APPARATUS AND ELECTRONIC DEVICE

(71) Applicant: Semiconductor Energy Laboratory Co., Ltd., Atsugi (JP)

(72) Inventors: Kazunori Watanabe, Machida (JP); Koji Kusunoki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/235,498

(22) Filed: Aug. 18, 2023

(65) Prior Publication Data
US 2023/0395036 A1 Dec. 7, 2023

Related U.S. Application Data

(63) Continuation of application No. 17/425,766, filed as application No. PCT/IB2020/050458 on Jan. 22, 2020, now Pat. No. 11,735,134.

(30) Foreign Application Priority Data

Feb. 5, 2019 (JP) .................................. 2019-018781

(51) Int. Cl.
*G09G 3/30* (2006.01)
*G02F 1/1362* (2006.01)
(Continued)

(52) U.S. Cl.
CPC ..... *G09G 3/3677* (2013.01); *G02F 1/136286* (2013.01); *G02F 1/1368* (2013.01);
(Continued)

(58) Field of Classification Search
None
See application file for complete search history.

(56) References Cited

U.S. PATENT DOCUMENTS 6,133,897 A 10/2000 Kouchi
6,891,916 B2 5/2005 Park et al.
(Continued)

FOREIGN PATENT DOCUMENTS

CN 001764051 A 4/2006
EP 0559321 A 9/1993
(Continued)

OTHER PUBLICATIONS

International Search Report (Application No. PCT/IB2020/050458) Dated Apr. 14, 2020.
(Continued)

*Primary Examiner* — Joseph R Haley
(74) *Attorney, Agent, or Firm* — Eric J. Robinson; Robinson Intellectual Property Law Office, P.C.

(57) ABSTRACT

A display apparatus with low power consumption is provided. The display apparatus includes a circuit for boosting a signal voltage output from a gate driver. The signal voltage from the gate driver can be boosted and then supplied to a pixel, which is suitable for driving a display device with a high threshold voltage. Furthermore, by utilizing a boosting function, output of the gate driver can be reduced, and power consumption can also be reduced. By combination with a pixel having a boosting function of image data, a display apparatus with lower power consumption can be achieved.

10 Claims, 26 Drawing Sheets

(51) Int. Cl.
*G02F 1/1368* (2006.01)
*G09G 3/36* (2006.01)
*G11C 19/28* (2006.01)

(52) U.S. Cl.
CPC ............ *G09G 3/3611* (2013.01); *G11C 19/28* (2013.01); *G09G 2310/0267* (2013.01); *G09G 2310/0286* (2013.01)

(56) References Cited

U.S. PATENT DOCUMENTS

| | | |
|---|---|---|
| 8,593,840 B2 | 11/2013 | Shionoiri et al. |
| 8,982,589 B2 | 3/2015 | Shionoiri et al. |
| 9,154,035 B2 | 10/2015 | Shionoiri et al. |
| 2003/0146911 A1 | 8/2003 | Nakanishi |
| 2004/0109526 A1 | 6/2004 | Park et al. |
| 2006/0006908 A1 | 1/2006 | Chung |
| 2006/0083033 A1 | 4/2006 | Myung et al. |
| 2007/0072439 A1 | 3/2007 | Akimoto et al. |
| 2008/0192883 A1 | 8/2008 | Chang et al. |
| 2008/0258998 A1 | 10/2008 | Miyake |
| 2010/0134396 A1 | 6/2010 | Umezaki |
| 2011/0101334 A1 | 5/2011 | Yamazaki et al. |
| 2011/0122670 A1 | 5/2011 | Yamazaki et al. |
| 2011/0199807 A1 | 8/2011 | Saito et al. |
| 2011/0204928 A1 | 8/2011 | Umezaki et al. |
| 2011/0215787 A1 | 9/2011 | Shionoiri et al. |
| 2011/0309904 A1 | 12/2011 | Aoki et al. |
| 2012/0076256 A1 | 3/2012 | Yonemaru et al. |
| 2012/0099368 A1 | 4/2012 | Kamata |
| 2013/0135278 A1 | 5/2013 | Toyotaka |
| 2013/0162305 A1 | 6/2013 | Watanabe |
| 2013/0243149 A1 | 9/2013 | Yamazaki |
| 2013/0314139 A1 | 11/2013 | Umezaki |
| 2014/0042443 A1 | 2/2014 | Yamazaki |
| 2014/0225644 A1 | 8/2014 | Aoki et al. |
| 2014/0300403 A1 | 10/2014 | Okamoto et al. |
| 2014/0333365 A1 | 11/2014 | Takahashi |
| 2015/0332626 A1* | 11/2015 | Toyomura .............. G11C 19/28 345/80 |
| 2016/0027810 A1 | 1/2016 | Umezaki |
| 2016/0070131 A1 | 3/2016 | Kimura et al. |
| 2016/0335962 A1 | 11/2016 | Xiao |
| 2018/0308871 A1 | 10/2018 | Wu et al. |
| 2020/0135132 A1* | 4/2020 | Tanaka ................ G09G 3/3677 |
| 2020/0142229 A1 | 5/2020 | Kusunoki et al. |
| 2020/0193928 A1 | 6/2020 | Kawashima et al. |
| 2020/0194527 A1 | 6/2020 | Kawashima et al. |
| 2020/0258921 A1 | 8/2020 | Takahashi et al. |
| 2020/0279525 A1 | 9/2020 | Kawashima et al. |
| 2020/0302889 A1 | 9/2020 | Takahashi et al. |
| 2020/0312238 A1 | 10/2020 | Watanabe et al. |
| 2020/0320930 A1 | 10/2020 | Toyotaka et al. |
| 2020/0326570 A1 | 10/2020 | Kawashima et al. |
| 2021/0110781 A1 | 4/2021 | Yamamoto |
| 2021/0183294 A1 | 6/2021 | Toyotaka et al. |
| 2021/0193029 A1 | 6/2021 | Yamazaki et al. |

FOREIGN PATENT DOCUMENTS

| | | |
|---|---|---|
| EP | 1331628 A | 7/2003 |
| JP | 05-281517 A | 10/1993 |
| JP | 2003-288062 A | 10/2003 |
| JP | 2006-113516 A | 4/2006 |
| JP | 2007-096055 A | 4/2007 |
| JP | 2007-123861 A | 5/2007 |
| JP | 2011-119674 A | 6/2011 |
| JP | 2014-064462 A | 4/2014 |
| KR | 2004-0048624 A | 6/2004 |
| KR | 2006-0034025 A | 4/2006 |
| TW | 200627775 | 8/2006 |
| WO | WO-2011/108367 | 9/2011 |

OTHER PUBLICATIONS

Written Opinion (Application No. PCT/IB2020/050458) Dated Apr. 14, 2020.

* cited by examiner

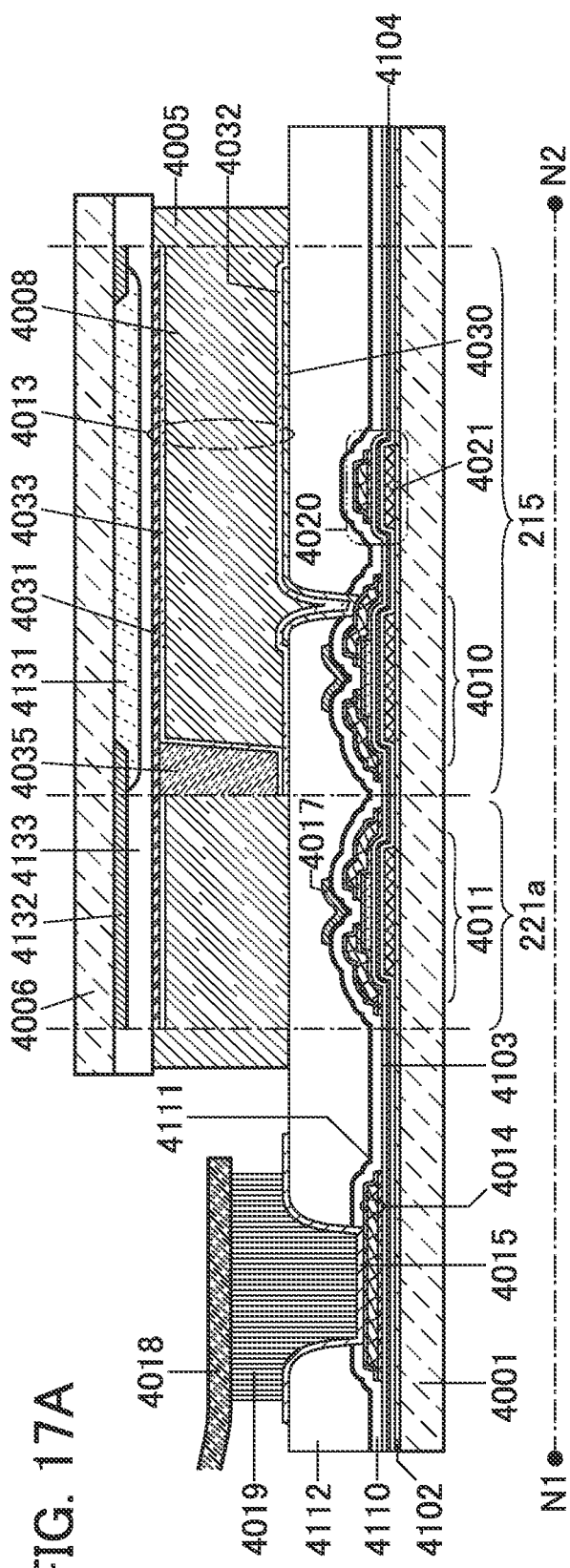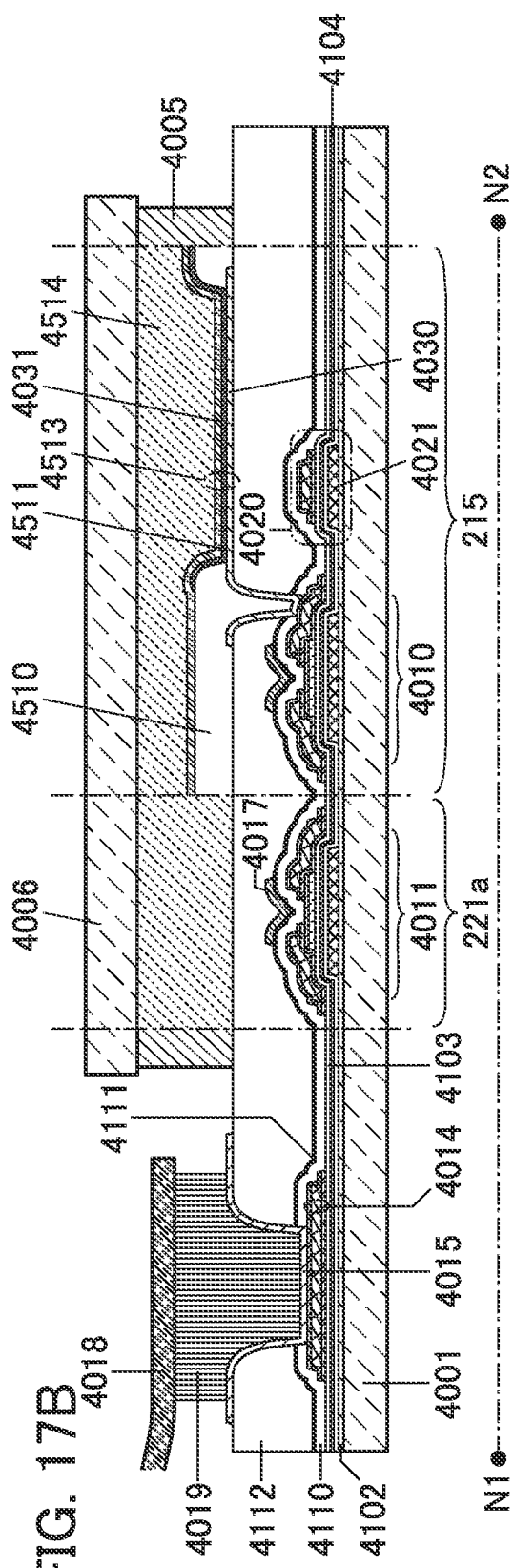

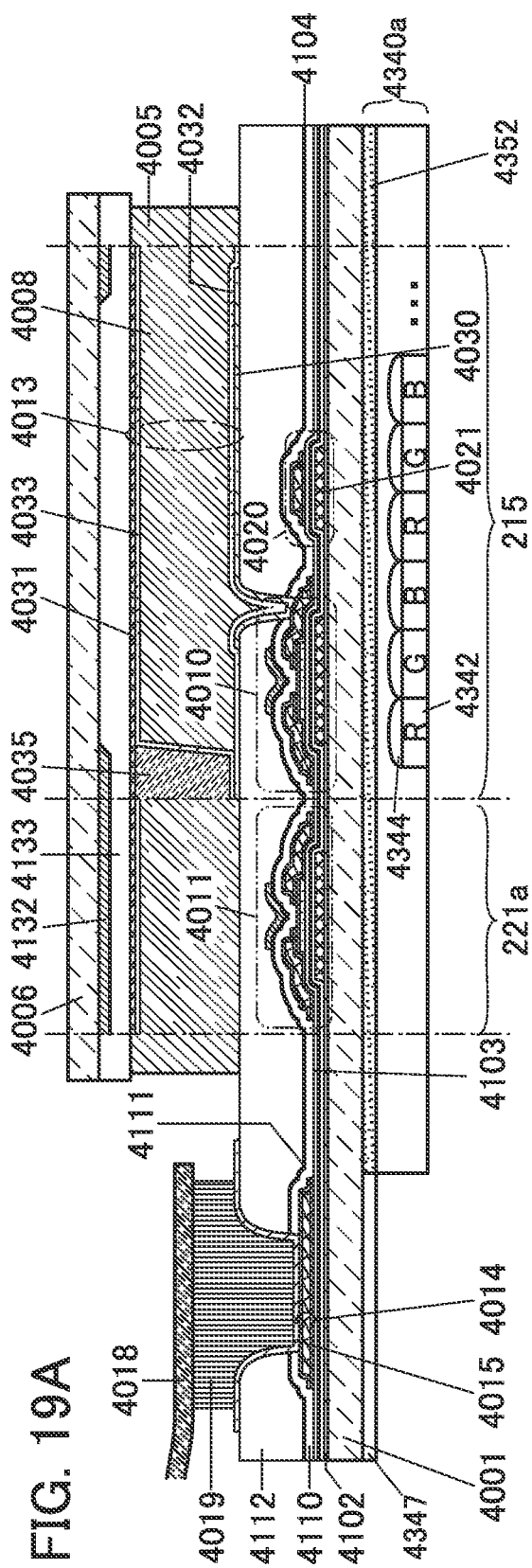
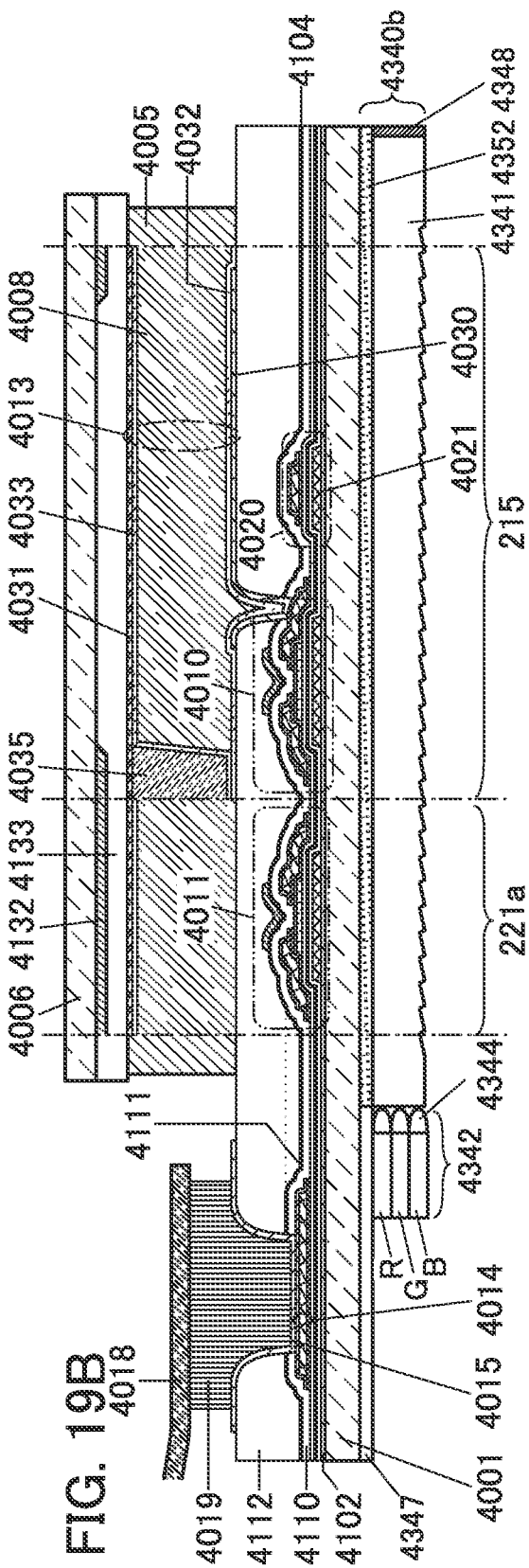
FIG. 19A
FIG. 19B

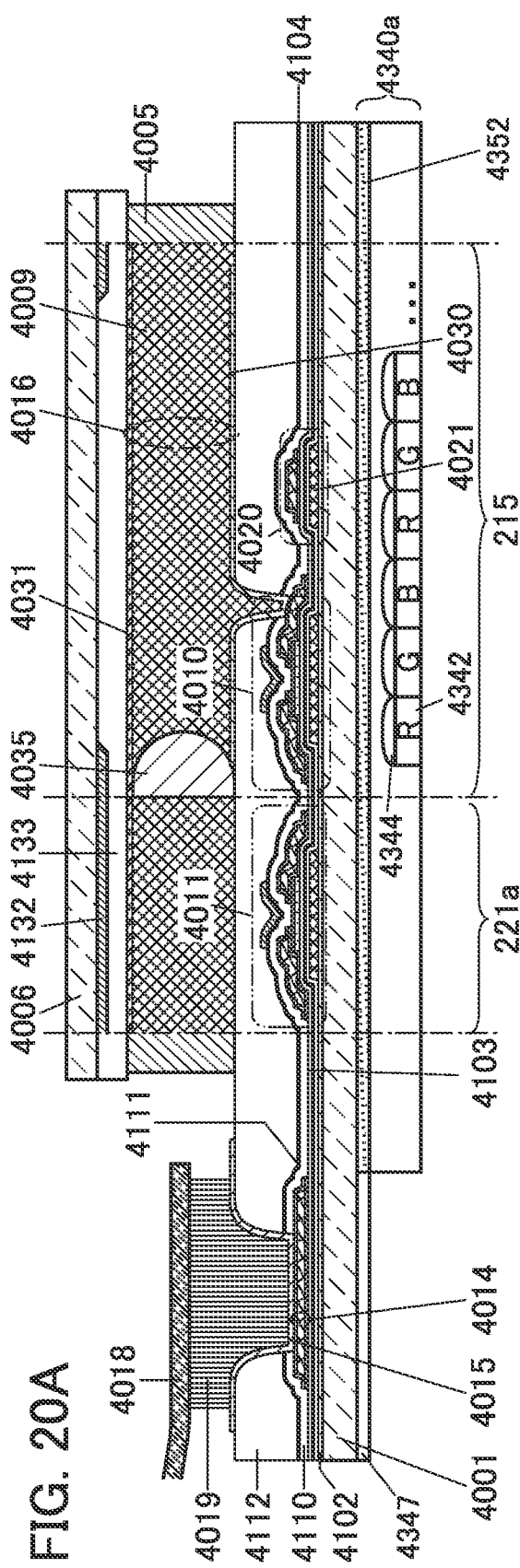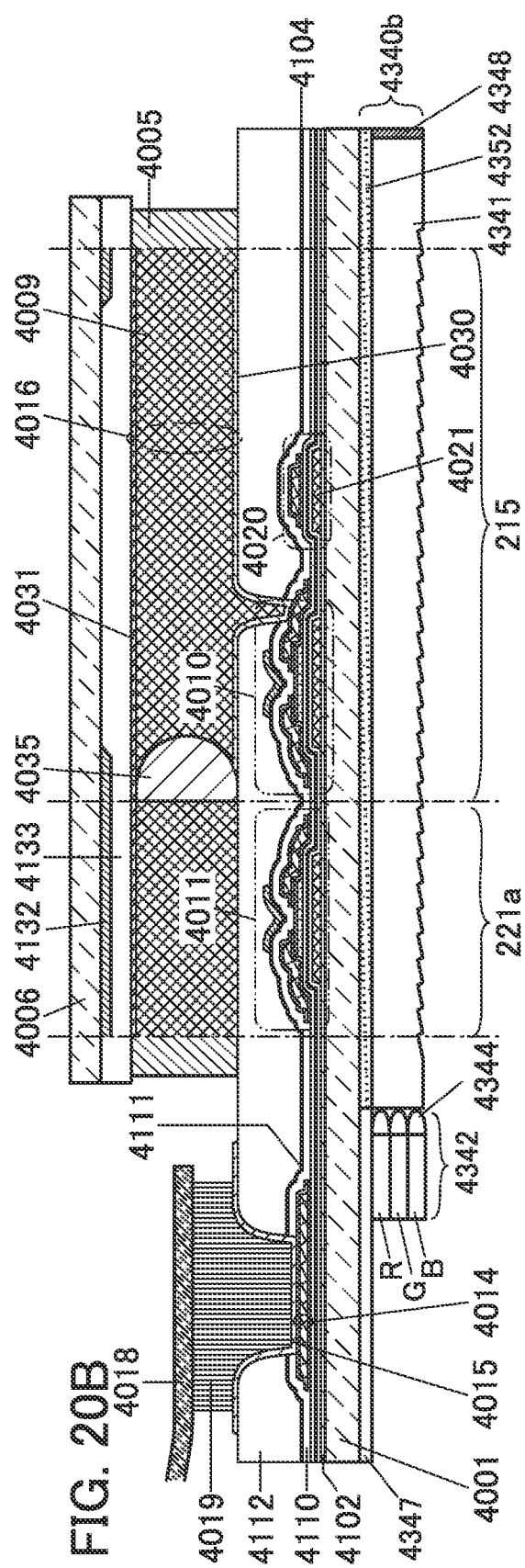
FIG. 20A
FIG. 20B

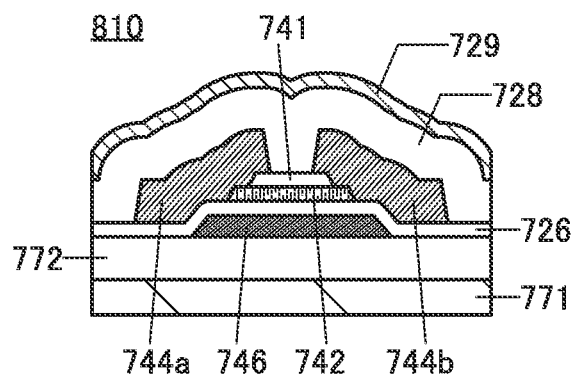
FIG. 22A1
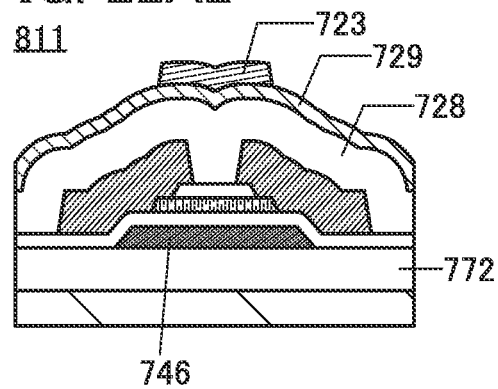
FIG. 22A2
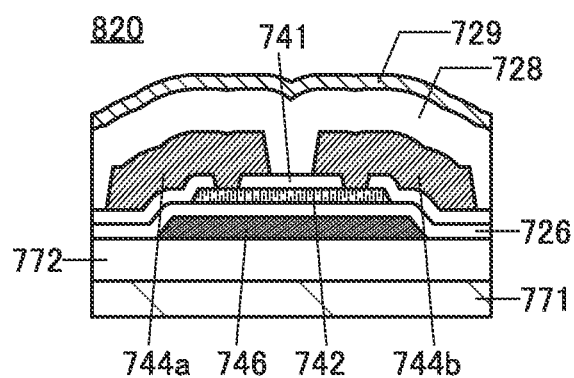
FIG. 22B1
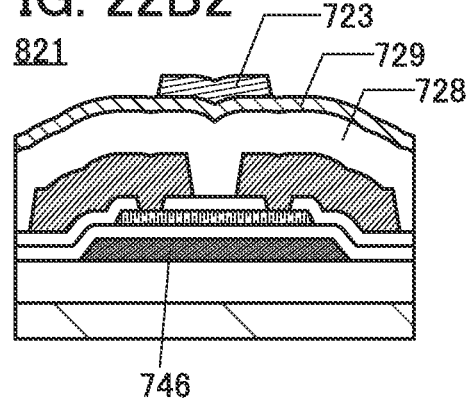
FIG. 22B2
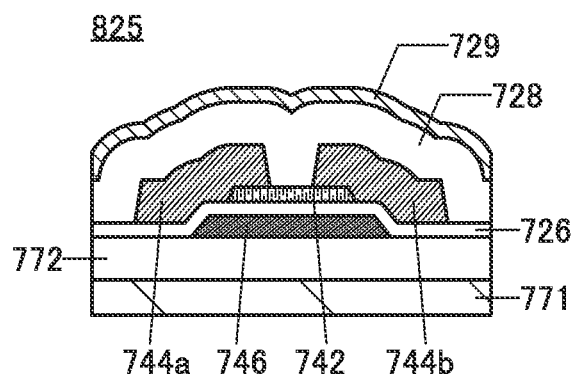
FIG. 22C1
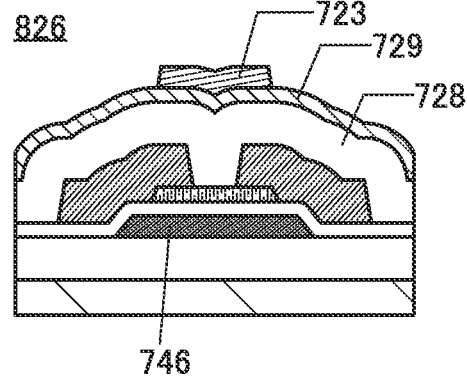
FIG. 22C2

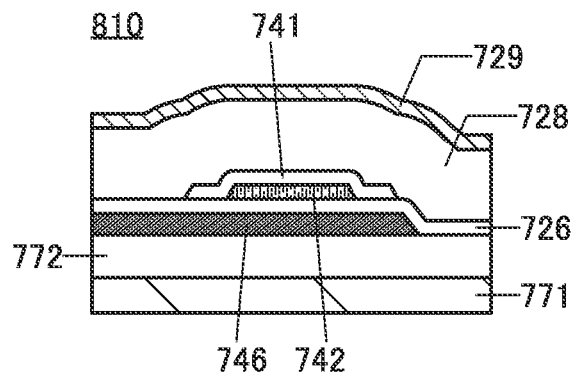
FIG. 23A1
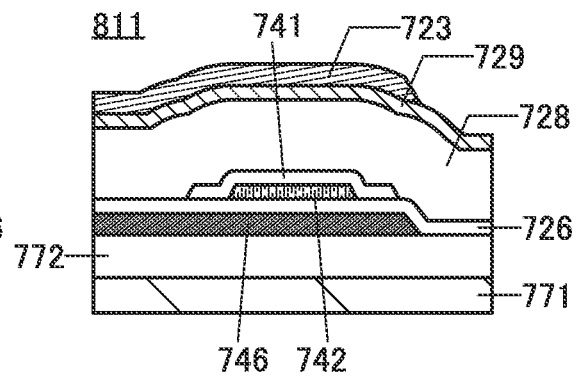
FIG. 23A2
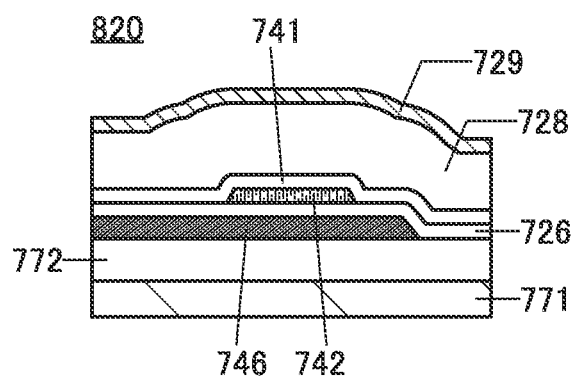
FIG. 23B1
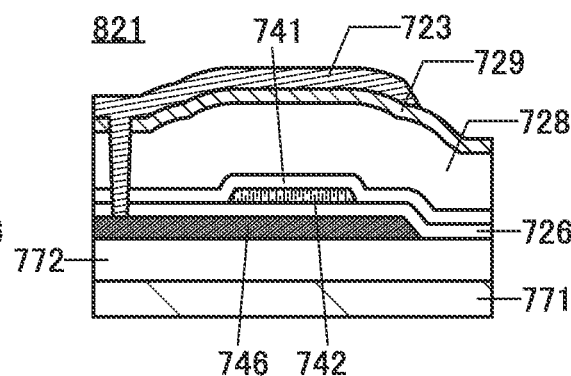
FIG. 23B2
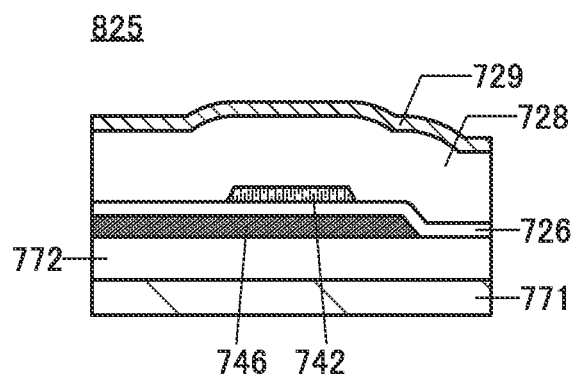
FIG. 23C1
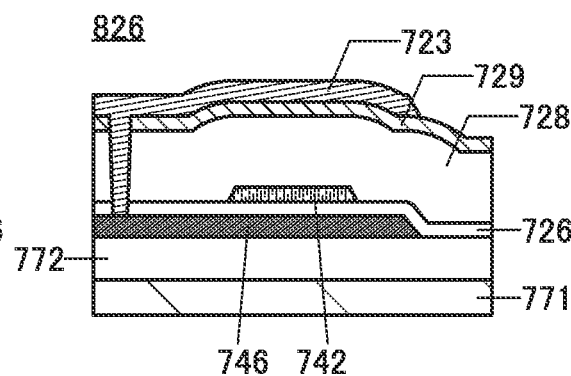
FIG. 23C2

FIG. 24A1
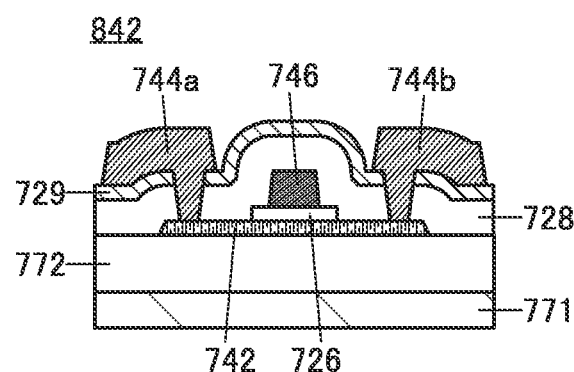
FIG. 24A2
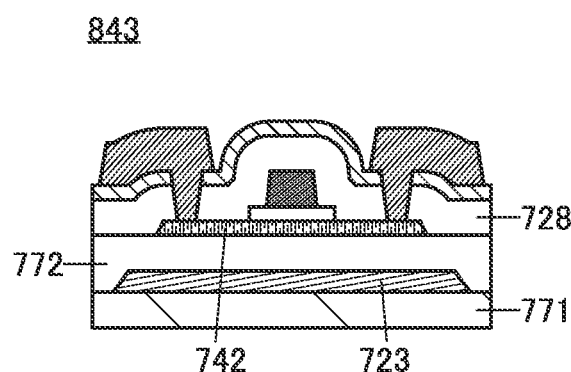
FIG. 24B1
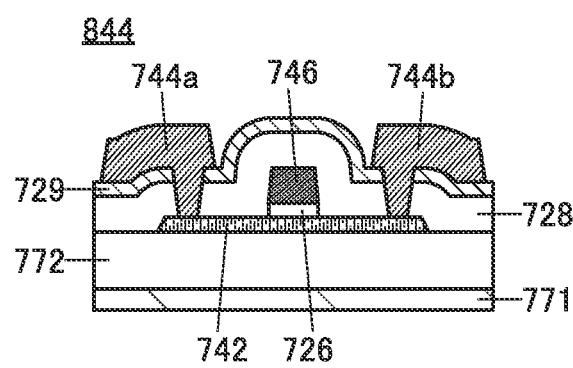
FIG. 24B2
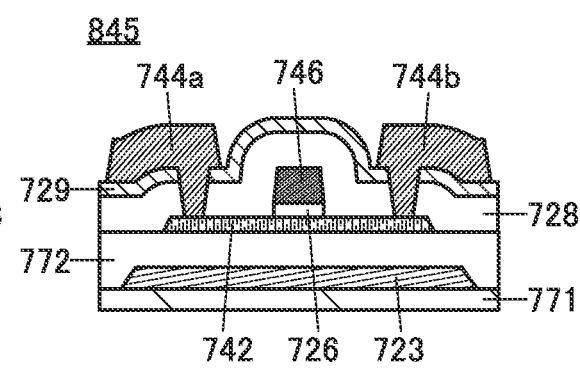
FIG. 24C1
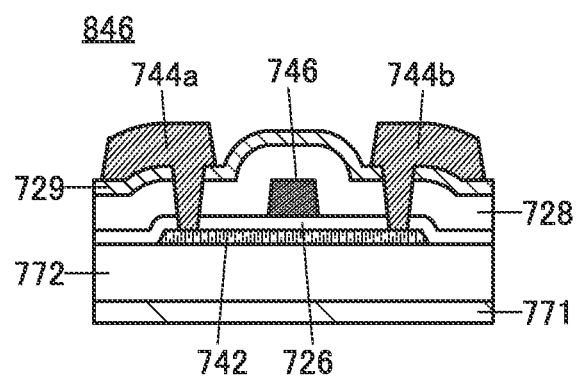
FIG. 24C2
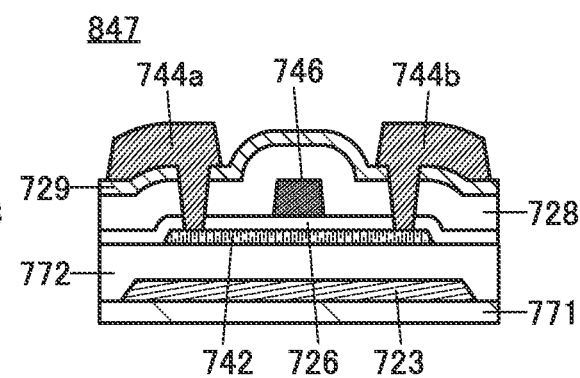

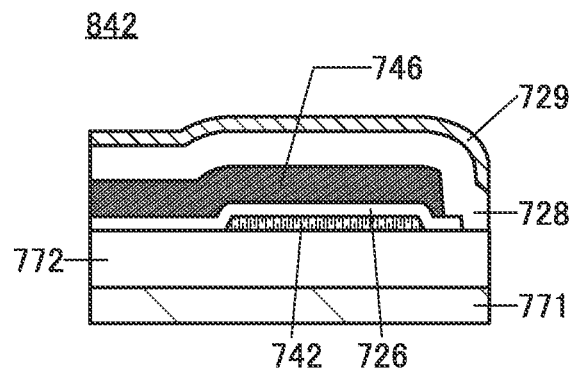
FIG. 25A1
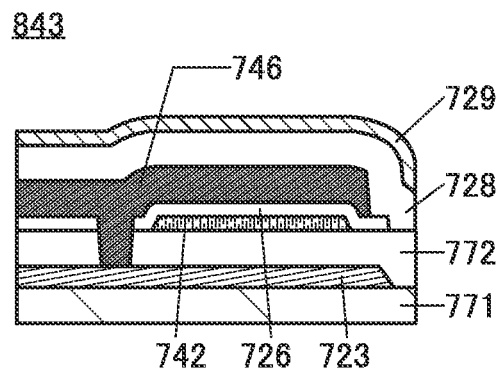
FIG. 25A2
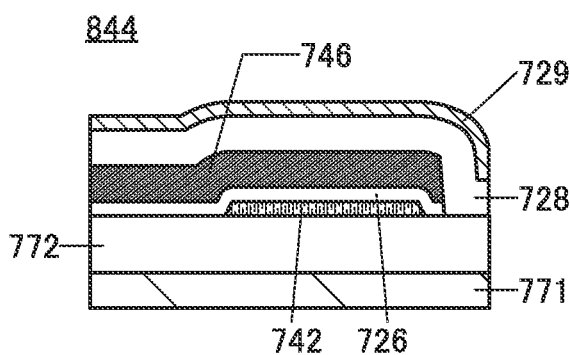
FIG. 25B1
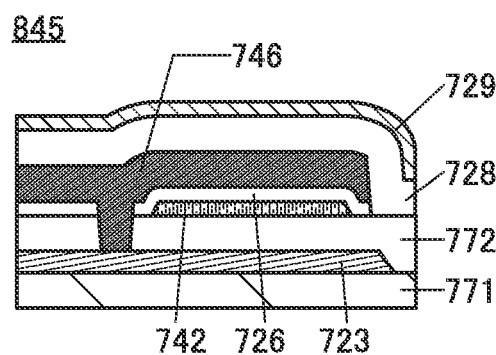
FIG. 25B2
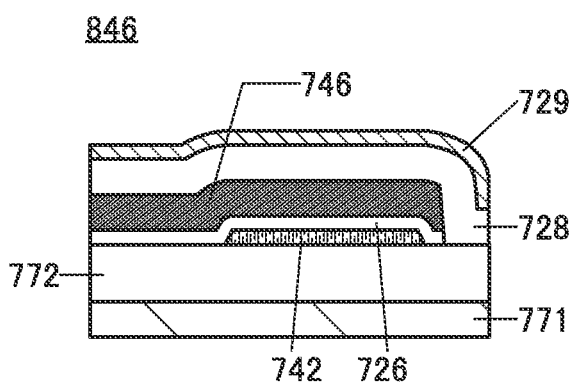
FIG. 25C1
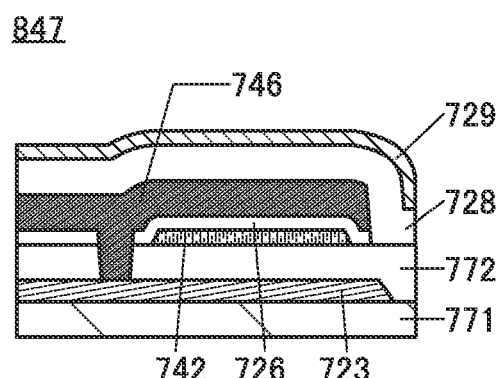
FIG. 25C2

DISPLAY APPARATUS AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting apparatus, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an imaging device, or an electronic device includes a semiconductor device.

BACKGROUND ART

A signal voltage with an appropriate amplitude is needed for the operation of a pixel included in a display apparatus; a transistor included in the pixel is operated with a relatively high voltage in some cases. For example, Patent Document 1 discloses a technique for boosting an output voltage of a gate driver.

In addition, a technique for forming transistors using a metal oxide formed over a substrate has been attracting attention. For example, Patent Document 2 and Patent Document 3 each disclose a technique in which a transistor containing zinc oxide or In—Ga—Zn-based oxide is used for a switching element or the like of a pixel in a display apparatus.

Patent Document 4 discloses a memory device having a structure in which a transistor with an extremely low off-state current is used in a memory cell.

REFERENCE

Patent Document

[Patent Document 1] Japanese Published Patent Application No. H5-281517
[Patent Document 2] Japanese Published Patent Application No. 2007-123861
[Patent Document 3] Japanese Published Patent Application No. 2007-96055
[Patent Document 4] Japanese Published Patent Application No. 2011-119674

SUMMARY OF THE INVENTION

Problems to be Solved by the Invention

A display apparatus is used for a variety of electronic devices. A low voltage operation of a display apparatus is one method to achieve low power consumption of an electronic device.

Meanwhile, a high voltage is needed depending on the kind of a display device (also referred to as display element) provided in a pixel and a driving method thereof. When the voltage of image data is high, a high signal voltage needs to be supplied also to a gate of a transistor for controlling writing of the image data. Even in such a case, low power consumption is desirable.

In addition, in a pixel, a display device needs to operate appropriately even in the case where image data at the time of writing has a relatively low voltage.

In view of the above, an object of one embodiment of the present invention is to provide a display apparatus with low power consumption. Another object is to provide a display apparatus capable of supplying a voltage higher than or equal to the output voltage of a gate driver to a pixel. Another object is to provide a display apparatus which operates with a low-cost driver. Another object is to provide a display apparatus capable of enhancing the luminance of a displayed image.

Another object is to provide a highly reliable display apparatus. Another object is to provide a novel display apparatus or the like. Another object is to provide an operation method of the display apparatus. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to a display apparatus with low power consumption.

The display apparatus includes a shift register, a boosting circuit, and a pixel; the shift register includes a first output terminal, a second output terminal, and a third output terminal; the boosting circuit includes a first transistor, a second transistor, a third transistor, a fourth transistor, and a first capacitor; the pixel includes a fifth transistor; one of a source and a drain of the first transistor is electrically connected to one electrode of the first capacitor; the one electrode of the first capacitor is electrically connected to one of a source and a drain of the third transistor; the one of the source and the drain of the third transistor is electrically connected to a gate of the fifth transistor; the other electrode of the first capacitor is electrically connected to one of a source and a drain of the second transistor and one of a source and a drain of the fourth transistor; a gate of the first transistor and a gate of the fourth transistor are electrically connected to the first output terminal; a gate of the second transistor is electrically connected to the second output terminal; and a gate of the third transistor is electrically connected to the third output terminal.

The shift register can output a signal voltage to the first output terminal, the second output terminal, and the third output terminal in this order.

The boosting circuit can further include a sixth transistor and a second capacitor; one of a source and a drain of the sixth transistor can be electrically connected to the first output terminal; the other of the source and the drain of the sixth transistor can be electrically connected to one electrode of the second capacitor and the gate of the first transistor; and the other electrode of the second capacitor can be electrically connected to the one of the source and the drain of the first transistor.

The boosting circuit can further include a seventh transistor, an eighth transistor, and a third capacitor; a gate of the seventh transistor can be electrically connected to the third output terminal; one of a source and a drain of the seventh transistor can be electrically connected to one electrode of the third capacitor and one of a source and a drain of the eighth transistor; and a gate of the eighth transistor can be electrically connected to the first output terminal.

The other of the source and the drain of the third transistor can be electrically connected to the other of the source and the drain of the fourth transistor.

The pixel can include a display element and can have a function of generating third data on the basis of first data and second data and a function of performing display using the display element in accordance with the third data. As the display element, a liquid crystal device can be used.

It is preferable that the transistors included in the boosting circuit and the pixel each contain a metal oxide in a channel formation region, and that the metal oxide include In, Zn, and M (M is Al, Ti, Ga, Ge, Sn, Y, Zr, La, Ce, Nd, or Hf).

Effect of the Invention

With the use of one embodiment of the present invention, a display apparatus with low power consumption can be provided. Alternatively, a display apparatus capable of supplying a voltage higher than or equal to the output voltage of a gate driver to a pixel can be provided. Alternatively, a display apparatus capable of operating with low-cost driver can be provided. Alternatively, a display apparatus capable of enhancing the luminance of a displayed image can be provided.

Alternatively, a highly reliable display apparatus can be provided. Alternatively, a novel display apparatus or the like can be provided. Alternatively, a method for operating any of the above display apparatuses can be provided. Alternatively, a novel semiconductor device or the like can be provided.

BRIEF DESCRIPTION OF THE DRAWINGS

FIG. 17A and FIG. 17B are diagrams each illustrating a display apparatus.

FIG. 19A and FIG. 19B are diagrams each illustrating a display apparatus.

FIG. 20A and FIG. 20B are diagrams each illustrating a display apparatus.

FIG. 22A1 to FIG. 22C2 are diagrams each illustrating a transistor.

FIG. 23A1 to FIG. 23C2 are diagrams each illustrating a transistor.

FIG. 24A1 to FIG. 24C2 are diagrams each illustrating a transistor.

FIG. 25A1 to FIG. 25C2 are diagrams each illustrating a transistor.

MODE FOR CARRYING OUT THE INVENTION

Figure 1:
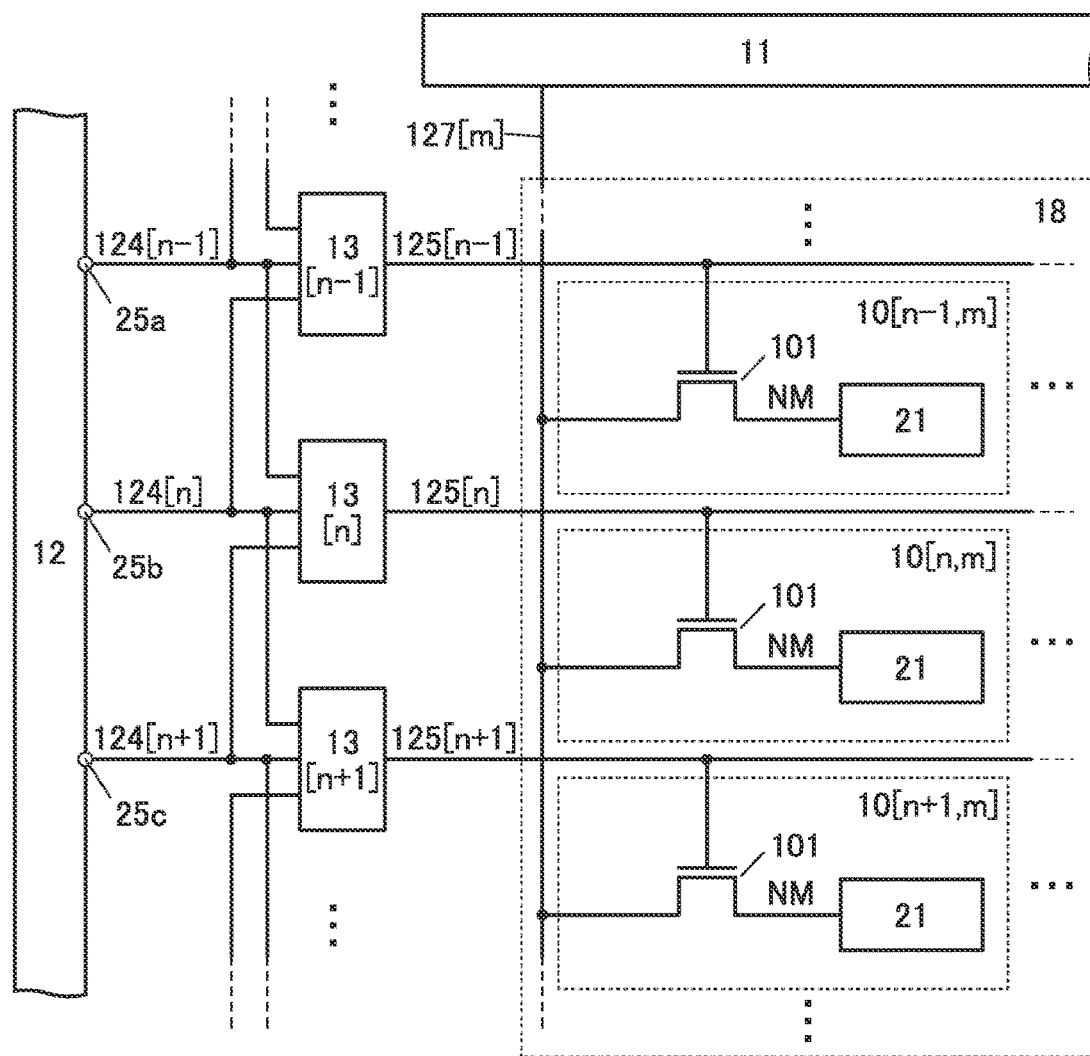
FIG. 1 is a diagram illustrating a display apparatus.

Embodiments are described in detail with reference to the drawings. Note that the present invention is not limited to the following description, and it will be readily understood by those skilled in the art that modes and details of the present invention can be modified in various ways without departing from the spirit and scope. Therefore, the present invention should not be interpreted as being limited to the description of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

One conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a configuration is included in direct connection.

Embodiment 1

In this embodiment, a display apparatus of one embodiment of the present invention is described with reference to drawings.

One embodiment of the present invention is a display apparatus including a circuit for boosting a signal voltage output from a gate driver. The signal voltage from the gate driver can be boosted and then supplied to a pixel, which is suitable for driving a display device with a high threshold voltage. Furthermore, power consumption can be reduced by reducing the output of the gate driver with the use of a boosting function. Furthermore, a display apparatus with low power consumption can be provided by combination of the circuit for boosting a signal voltage output from the gate driver and a pixel having a function of boosting image data. In this structure, a general driver can be used for both of a source driver and a gate driver even when the operation of a pixel circuit needs a high voltage; thus, a display apparatus with a low cost can be achieved.

<Display Apparatus>

FIG. 1 is a diagram illustrating a display apparatus of one embodiment of the present invention. The display apparatus includes a plurality of pixels 10, circuits 13, a source driver 11, and a gate driver 12. The source driver 11 is electrically connected to the pixels 10. The gate driver 12 is electrically connected to the circuits 13. The circuits 13 are electrically connected to the pixels 10.

The pixel 10 includes a transistor 101 and a circuit 21. The circuit 21 includes a display device. The circuit 21 can also include a transistor, a capacitor, or the like as appropriate. A gate of the transistor 101 is electrically connected to a wiring 125. A wiring that connects the transistor 101 and the circuit 21 is referred to as a node NM. Note that the pixel 10 may have another structure. The plurality of pixels 10 are provided to form a pixel array 18.

The circuit 13 can be provided row by row, and can be electrically connected to a pixel 10 arranged in the same row. FIG. 1 illustrates the pixels 10 arranged in the m-th column (a pixel 10[n−1, m], a pixel 10[n, m], a pixel 10[n+1, m] (m and n are each a natural number greater than or equal to 1) and the circuits 13 each arranged in a corresponding row (a circuit 13[n−1], a circuit 13[n], and a circuit 13[n+1]), in the n-th row and rows in front of and behind the n-th row.

The circuit 13 is a boosting circuit and has a function of boosting a signal voltage for driving the pixel which is supplied from the gate driver 12. The circuit 13 is electrically connected to the pixel 10 through the wiring 125.

A sequential circuit such as a shift register can be used for the source driver 11 and the gate driver 12. Note that two or more source drivers 11 and/or two or more gate drivers 12 may be provided to drive the pixel 10. The source driver 11 is electrically connected to the pixel 10 through the wiring 127.

An output terminal 25a of the gate driver 12 is connected to a wiring 124[n−1], an output terminal 25b is connected to a wiring 124[n], and an output terminal 25c is connected to a wiring 124[n+1]. The gate driver 12 includes the output terminal 25a, the output terminal 25b, and the output terminal 25c, and can output a signal voltage in the order of the output terminal 25a, the output terminal 25b, and the output terminal 25c. Note that the output terminal 25a, the output terminal 25b, and the output terminal 25c are output terminals whose timing of outputting a signal voltage does not overlap one another. For example, besides three output terminals from which a signal voltage is sequentially output, every other output terminal, every third output terminal, or the like may output a signal voltage.

In addition to the wiring 124[n], the wiring 124[n−1] and the wiring 124[n+1] are electrically connected to the circuit 13[n]. Similarly, the circuit 13[n−1] and the circuit 13[n+1] are electrically connected to the three output terminals from which the gate driver 12 outputs a signal voltage. Note that the circuit 13 can be electrically connected to four or more output terminals included in the gate driver 12.

<Boosting Circuit>

Figure 2A:
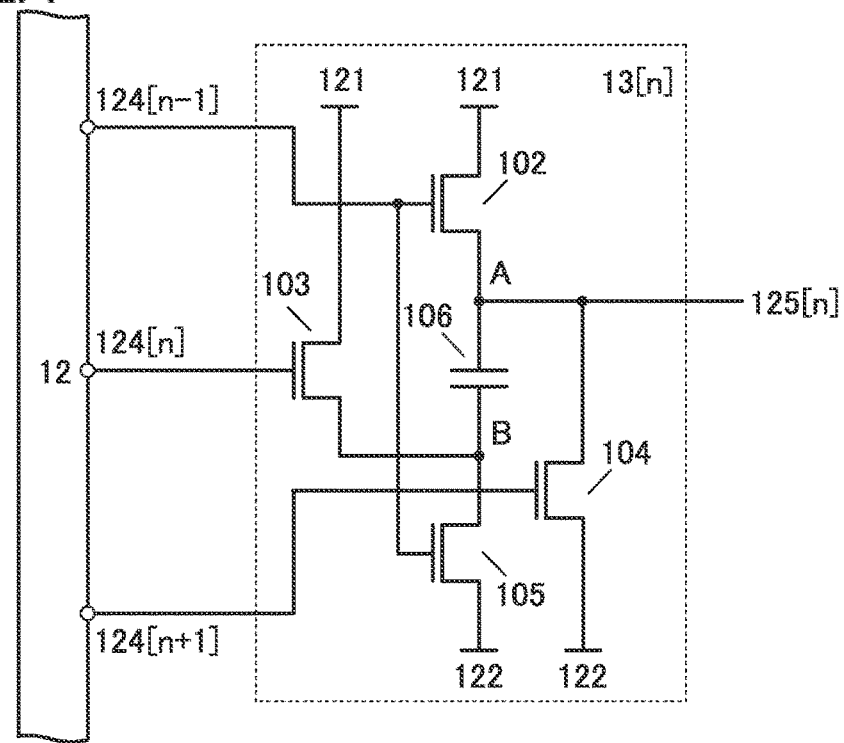
FIG. 2A is a diagram illustrating a boosting circuit.

FIG. 2A illustrates an example of a structure of the circuit 13. The circuit 13 can have a structure including a transistor 102, a transistor 103, a transistor 104, a transistor 105, and a capacitor 106. FIG. 2 shows the circuit 13[n] electrically connected to the pixel 10 in the n-th row.

One of a source and a drain of the transistor 102 is electrically connected to one electrode of the capacitor 106. The one electrode of the capacitor 106 is electrically connected to one of a source and a drain of the transistor 104. The other electrode of the capacitor 106 is electrically connected to one of a source and a drain of the transistor 103 and one of a source and a drain of the transistor 105.

A gate of the transistor 102 is electrically connected to the wiring 124[n−1]. A gate of the transistor 103 is electrically connected to the wiring 124[n]. A gate of the transistor 104 is electrically connected to the wiring 124[n+1]. A gate of the transistor 105 is electrically connected to the wiring 124[n−1]. The other of the source and the drain of the transistor 102 is electrically connected to a wiring 121. The other of the source and the drain of the transistor 103 is electrically connected to the wiring 121. The other of the source and the drain of the transistor 104 is electrically connected to a wiring 122. The other of the source and the drain of the transistor 105 is electrically connected to the wiring 122.

The wirings 121 and 122 can each have a function of a power supply line. For example, the wiring 121 can function as a high potential power supply line, and the wiring 122 can function as a low potential power supply line.

Here, a wiring to which the one of the source and the drain of the transistor 102, the one electrode of the capacitor 106, and the one of the source and the drain of the transistor 104 are connected is referred to as a node A. A wiring to which the other electrode of the capacitor 106, the one of the source and the drain of the transistor 103, and the one of the source and the drain of the transistor 105 are connected is referred to as a node B. The node A functions as an output terminal, to which the wiring 125[n] is electrically connected. The gate of the transistor 102 and the gate of the transistor 105, to which the wiring 124[n−1] is connected, function as first input terminals. The gate of the transistor 103 to which the wiring 124[n] is connected functions as a second input terminal. The gate of the transistor 104 to which the wiring 124[n+1] is connected functions as a third input terminal.

<Description of Boosting Operation>

In the circuit 13, first, "V1" (high potential) is input to the first input terminals (the gate of the transistor 102 and the gate of the transistor 105), so that the potential of the node A is set to "V1" (high potential) and the potential of the node B is set to "V0" (low potential). At this time, "V1−V0" is retained in the capacitor 106. Next, "V0" is input to the first input terminals, and "V1" is input to the second input terminal (the gate of the transistor 103), whereby "V1" is input to the node B with the node A floating.

At this time, when the capacitance value of the capacitor 106 is $C_{106}$ and the capacitance value of the node A is CA, the potential of the node A becomes "V1+($C_{106}$/($C_{106}$+CA))×(V1−V0)". Here, when the value of $C_{106}$ is sufficiently higher than that of CA, $C_{106}$/($C_{106}$+CA) approximates one, and the potential of the node A becomes "2V1−V0".

At this time, when "V0"=0, the potential of the node A approximates "2V1". This means that the circuit 13 can output a potential approximately twice as high as the potential input thereto.

As described above, the circuit 13 outputs the boosted potential, and a transistor in a pixel can be turned on.

Furthermore, the circuit 13 outputs a potential at which the transistor in the pixel is turned off at next timing. Such a potential can be supplied to the node A from the wiring 122 through the transistor 104 by inputting "V1" to the third input terminal (the gate of the transistor 104).

Since "V1" is input to the node A or the node B through the transistor, the potential is lower than the potential actually input to the gate by the threshold voltage (Vin) of the transistor. In this embodiment, for simplification of explanation, the absolute value of Vin is assumed sufficiently low (approximately 0 V), and description thereof is omitted.

The node A and the node B function as retention nodes. The transistor connected to the corresponding node is turned on, whereby data can be written to the node. The transistor is turned off, whereby the data can be retained in the node. The use of a transistor with an extremely low off-state current as the transistor enables leakage current to be reduced and the potential of the node to be retained for a long time. As the transistor, a transistor using a metal oxide in a channel formation region (hereinafter referred to as an OS transistor) can be used, for example.

Specifically, OS transistors are preferably used as any or all of the transistors included in the circuit 13. An OS transistor may be also used for a component included in the circuit 21. In the case of operating within a range where the amount of leakage current is acceptable, a transistor containing Si in a channel formation region (hereinafter, Si transistor) may be used. Alternatively, an OS transistor and a Si transistor may be used together. Examples of the Si transistor include a transistor containing amorphous silicon and a transistor containing crystalline silicon (microcrystalline silicon, low-temperature polysilicon, or single crystal silicon). The above-described structures on the transistors can be applied to other circuits in this embodiment.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In the OS transistor, the semiconductor layer has a large energy gap, and thus the OS transistor can have an extremely low off-state current of several yA/μm (current per micrometer of a channel width). An OS transistor has features such that impact ionization, an avalanche breakdown, a short-channel effect, or the like does not occur, which are different from those of a Si transistor. Thus, the use of an OS transistor enables formation of a highly reliable circuit. Moreover, variations in electrical characteristics due to crystallinity unevenness, which are caused in Si transistors, are less likely to occur in OS transistors.

The semiconductor layer included in the OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium). Besides the above In-M-Zn oxide, an In oxide, an In—Ga oxide, or an In—Zn oxide may be used for the semiconductor layer included in the OS transistor. Note that when a semiconductor layer having high proportion of indium is used, the on-state current, the field-effect mobility, or the like of the OS transistor can be increased. The In-M-Zn-based oxide can be formed by, for example, a sputtering method, an ALD (Atomic layer deposition) method, an MOCVD (Metal organic chemical vapor deposition) method, or the like.

In the case of forming a film of In-M-Zn oxide by a sputtering method, it is preferable that the atomic ratio of metal elements in a sputtering target satisfy In M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:3, In:M:Zn=5:1:6, or In:M:Zn=5:1:7, In:M:Zn=5:1:8, or In:M:Zn=10:1:3. In the case where the oxide semiconductor contained in the semiconductor layer is an In—Zn oxide, it is preferable that the atomic ratio of metal elements in a sputtering target used for forming a film of the In—Zn oxide satisfy In Zn. As the atomic ratio of metal elements in such a sputtering target, In:Zn=1:1, In:Zn=2:1, In:Zn=5:1, In:Zn=5:3, In:Zn=10:1, In:Zn=10:3, and the like are preferable.

An oxide semiconductor with low carrier concentration is used for the semiconductor layer. For example, an oxide semiconductor which has a carrier concentration lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, yet further preferably lower than $1\times10^{10}/cm^3$, and higher than or equal to $1\times10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that, without limitation to these, a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier concentration, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased, and the semiconductor layer becomes n-type. Thus, the concentration of silicon or carbon (the concentration obtained by Secondary Ion Mass Spectrometry) in the semiconductor layer is set to $2\times10^{18}$ atoms/$cm^3$ or lower, preferably $2\times10^{17}$ atoms/$cm^3$ or lower.

An alkali metal and an alkaline earth metal might generate carriers when bonded to an oxide semiconductor, in which case the off-state current of the transistor might be increased. Therefore, the concentration of alkali metal or alkaline earth metal in the semiconductor layer (measured by secondary ion mass spectrometry) is set to $1\times10^{18}$ atoms/$cm^3$ or lower, preferably $2\times10^{16}$ atoms/$cm^3$ or lower.

When nitrogen is included in the oxide semiconductor forming the semiconductor layer, electrons serving as carriers are generated and the carrier concentration increases, and the semiconductor layer easily becomes n-type. Thus, a transistor using an oxide semiconductor that contains nitrogen is likely to be normally-on. Hence, the concentration of nitrogen in the semiconductor layer (measured by secondary ion mass spectrometry) is preferably set to $5\times10^{18}$ atoms/cm$^3$ or lower.

When hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

Oxide semiconductors (metal oxides) can be classified into a single crystal oxide semiconductor and a non-single-crystal oxide semiconductor. Examples of the non-single-crystal oxide semiconductors include a CAAC-OS (C-Axis-Aligned Crystalline Oxide Semiconductor), a polycrystalline oxide semiconductor, an nc-OS (nanocrystalline oxide semiconductor), an amorphous-like oxide semiconductor (a-like OS), and an amorphous oxide semiconductor. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a CAC (Cloud-Aligned Composite)-OS, which is one embodiment of a non-single-crystal semiconductor layer, is described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film (this composition is also referred to as a cloud-like composition).

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \le x0 \le 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible; for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the XRD measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{Z2}$ or $InO_{X1}$ as a main component, the conductivity of an oxide semiconductor is generated. Accordingly, when the regions containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is superior to that of the region containing $In_{X2}Zn_{Y2}O_{Z2}$ or $InO_{X1}$ as a main component. In other words, when the regions containing $GaO_{X3}$ or the like as a main component are distributed in an oxide semiconductor, leakage current can be suppressed and a favorable switching operation can be achieved.

Accordingly, when a CAC-OS is used in a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Lm) and high field-effect mobility (μ) can be achieved.

A semiconductor element using a CAC-OS has high reliability. Thus, the CAC-OS is suitably used as a material in a variety of semiconductor devices.

Operation Example of Boosting Circuit

Figure 2B:
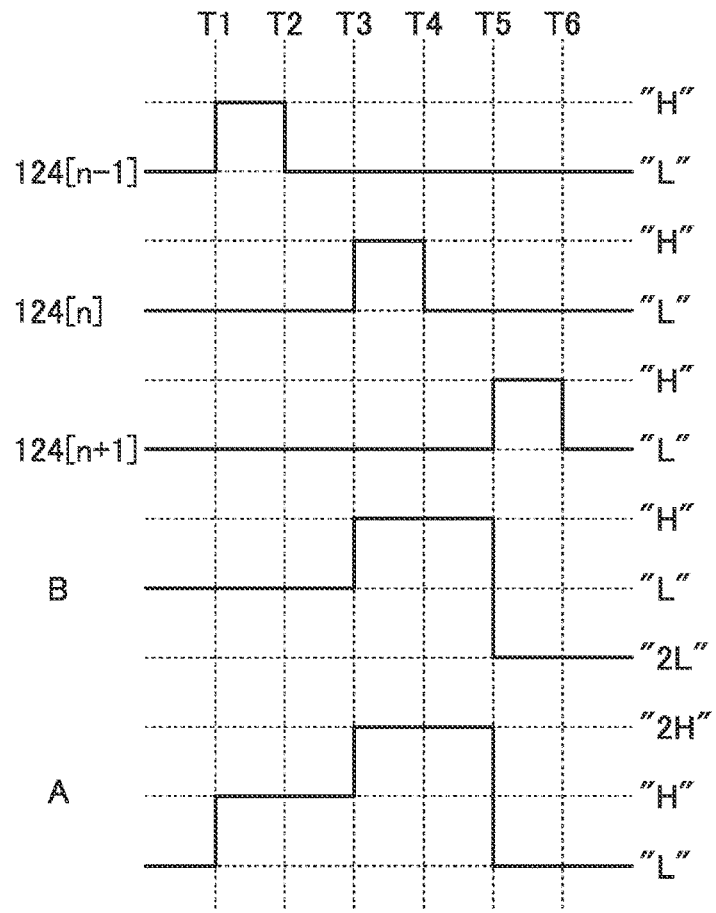
FIG. 2B is a timing chart illustrating the operation of the boosting circuit.

An operation example of the circuit 13 illustrated in FIG. 2A is described using the timing chart in FIG. 2B. Note that in the description below or in the timing chart, a low potential is represented by "L", a potential that is twice as low as the low potential is represented by "2L", a potential that is three times as low as the low potential is represented by "3L", a high potential is represented by "H", a potential that is twice as high as the high potential is represented by "2H", and a potential that is three times as high as the high potential is represented by "3H". In addition, the condition is such that the wiring 121 is supplied with "H", the wiring 122 is supplied with "L", and the wiring 124 is supplied with "H" or "L".

Note that in potential distribution, potential coupling, or potential loss, detailed changes due to a circuit structure, operation timing, or the like are not considered. A change in potential due to capacitive coupling using a capacitor depends on the capacitance ratio of the capacitor to a component connected thereto; however, for simplicity of the description, the capacitance value of the component is assumed sufficiently small.

At time T1, when the potential of the wiring 124[n−1] becomes "H" (the potential of the wiring 124[n] and the potential of the wiring 124[n+1] are "L"), the transistor 102 is turned on and the potential of the node A becomes "H". Furthermore, the transistor 105 is turned on and the potential of the node B becomes "L".

At time T2, when the potential of the wiring 124[n−1] becomes "L" (the potential of the wiring 124[n] and the potential of the wiring 124[n+1] are "L"), the transistor 102 is turned off and the potential of the node A is retained at "H". In addition, the transistor 105 is turned off and the potential of the node B is retained at "L".

At time T3, when the potential of the wiring 124[n] becomes "H" (the potential of the wiring 124[n−1] and the potential of the wiring 124[n+1] are "L"), the transistor 103 is turned on, and the potential of the node B changes from "L" to "H". Accordingly, the amount of change is added to the potential of the node A in accordance with the capacitance ratio of the capacitor 106 to the node A, whereby the potential of the node A becomes "H+(H−L)". In other words, when "L"=0, the potential of the node A becomes "2H".

At time T4, when the potential of the wiring 124[n] becomes "L" (the potential of the wiring 124[n−1] and the potential of the wiring 124[n+1] are "L"), the transistor 103 is turned off and the potential of the node A is retained at "2H".

At time T5, when the potential of the wiring 124[n+1] becomes "H" (the potential of the wiring 124[n−1] and the potential of the wiring 124[n] are "L"), the transistor 104 is turned on and the potential of the node A becomes "L".

At time T6, when the potential of the wiring 124[n+1] becomes "L" (the potential of the wiring 124[n−1] and the potential of the wiring 124[n] are "L"), the transistor 104 is turned off and the potential of the node A is retained at "L".

The writing operation in the pixel 10 can be performed in a period during which the potential "2A" is supplied to the node A (the wiring 125 [n]) (at and after time T3 and before time T5). Furthermore, at and after T5, the potential of the node A is retained at "L"; thus, an image signal written to the pixel 10 can be retained to the next frame (next operation).

Modification Example 1 of Boosting Circuit

Figure 3A:
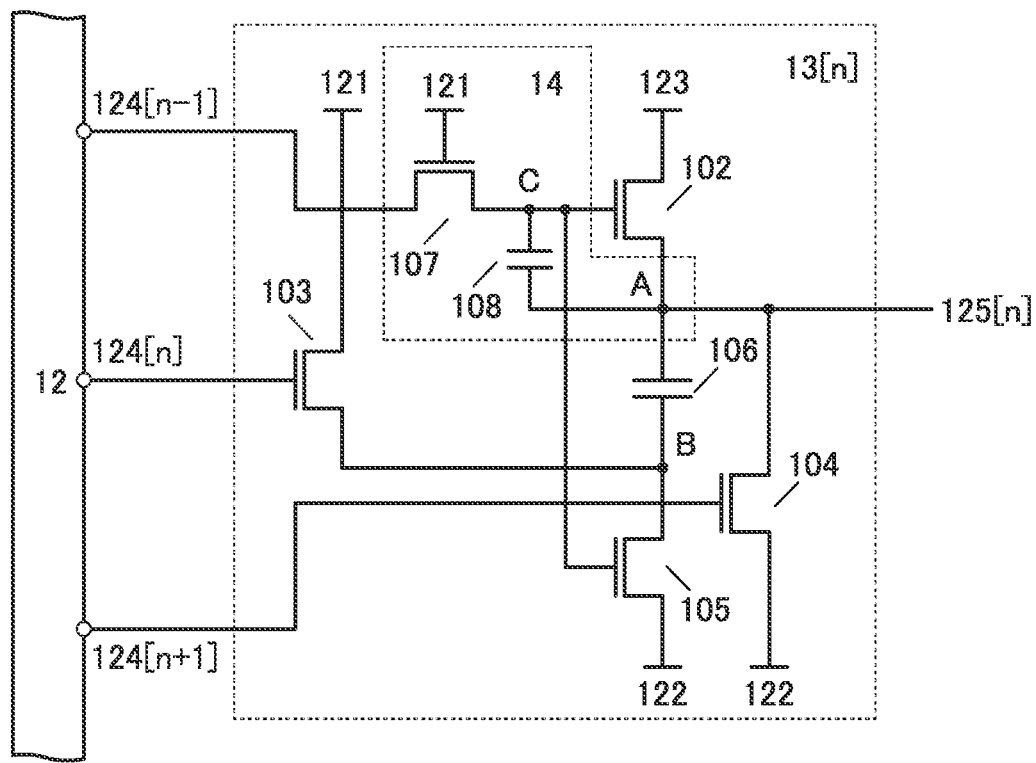
FIG. 3A and FIG. 3B are diagrams each illustrating a boosting circuit.

FIG. 3A illustrates a modification example of the circuit 13. The circuit 13 illustrated in FIG. 3A is different from the circuit 13 in FIG. 2A in that a circuit 14 is included and the other of the source and the drain of the transistor 102 is electrically connected to a wiring 123. The circuit 14 has a function of increasing the voltage output from the circuit 13.

The circuit 14 can have a structure including a transistor 107 and a capacitor 108. One of a source and a drain of the transistor 107 is electrically connected to the wiring 124[n−1]. The other of the source and the drain of the transistor 107 is electrically connected to one electrode of the capacitor 108 and the gate of the transistor 102. The other electrode of the capacitor 108 is electrically connected to the node A. In this structure, the one of the source and the drain of the transistor 107 serves as the first input terminal.

A gate of the transistor 107 is electrically connected to the wiring 121. The other of the source and the drain of the transistor 102 is electrically connected to the wiring 123. Here, the wiring 123 is a power supply line for supplying a potential higher than or equal to the potential of the wiring 121. Note that the other of the source and the drain of the transistor 102 may be electrically connected to the wiring 121.

The circuit 14 is incorporated in the circuit 13 of one embodiment of the present invention, whereby the circuit 13 can have a bootstrap effect. By the bootstrap effect, a signal voltage higher than a single voltage that is input can be output.

The bootstrap operation is as follows. First, when a potential "H" is input to a node C (a wiring to which the other of the source and the drain of the transistor 107, the one electrode of the capacitor 108, the gate of the transistor 102, and the gate of the transistor 105 are connected) through the transistor 107, current flows through the transistor 102 until the potential of the node A increases from "L" to "H". At this time, since the potential of the node C is increased to "H" or higher due to capacitive coupling of the capacitor 108, more current flows through the transistor 102; thus, the potential of the node A can be increased further.

Note that the potential "H" is supplied to the one of the source and the drain and the gate of the transistor 107. When the potential of the other of the source and the drain of the transistor 107 (the node C) is higher than "H", current does not flow to the transistor 107. That is, the transistor 107 functions as a diode. The structure in which the circuit 14 is included can be applied to another circuit in this embodiment.

The circuit 13 illustrated in FIG. 3A can be operated according to the timing chart in FIG. 2B. Note that as described above, at time T1 to time T5, the potential of the node A can be higher than that of the circuit 13 in FIG. 2B.

Modification Example 2 of Boosting Circuit

Figure 3B:
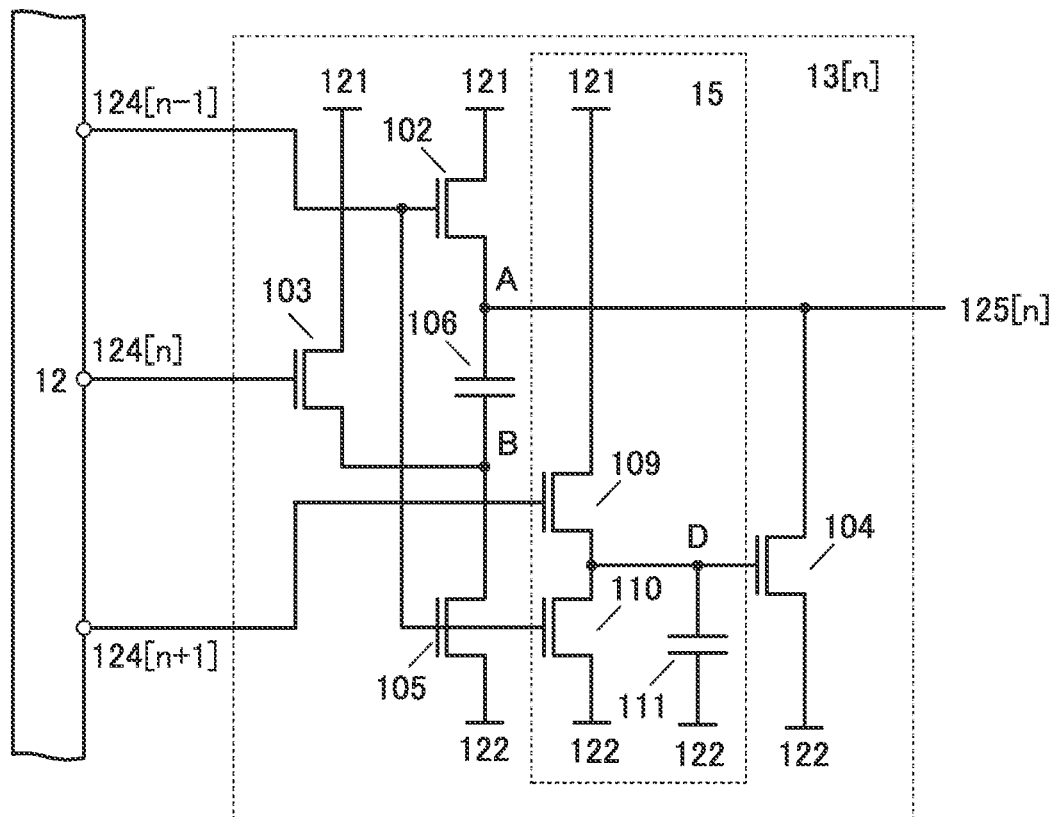

FIG. 3B illustrates another modification example of the circuit 13. The circuit 13 illustrated in FIG. 3B is different from the circuit 13 illustrated in FIG. 2A in that a circuit 15 is included. The circuit 15 is a circuit that controls the supply of a low potential to the wiring 125.

The circuit 15 can include a transistor 109, a transistor 110, and a capacitor 111. One of a source and a drain of the transistor 109 is electrically connected to the wiring 121. The other of the source and the drain of the transistor 109 is electrically connected to one of a source and a drain of the transistor 110, one electrode of the capacitor 111, and the gate of the transistor 104. The other of the source and the drain of the transistor 110 is electrically connected to the wiring 122. The other electrode of the capacitor 111 is electrically connected to the wiring 122. A gate of the transistor 109 is electrically connected to the wiring 124[n+1]. A gate of the transistor 110 is electrically connected to the wiring 124[n−1]. In this structure, the gates of the transistor 102, transistor 105, and transistor 110 serve as the first input terminals, and the gate of the transistor 109 serves as the third input terminal.

In the circuit 13 illustrated in FIG. 2A, the transistor 104 is turned off at time T6 in the timing chart illustrated in FIG. 2B; thus, the wiring 125 is brought into a floating state. At this time, if leakage current of the transistor 102 is relatively high, the potential of the wiring 125 is increased and thus a malfunction of the pixel 10 might occur.

The circuit 15 is a circuit for retaining the potential of a node D (a wiring to which the gate of the transistor 104, the one electrode of the capacitor 111, the other of the source and the drain of the transistor 109, and the one of the source and the drain of the transistor 110 are connected), and can hold the transistor 104 in a conduction state or a non-conduction state.

The operation of the circuit 15 is described as follows. First, when a signal voltage "H" is input to the first input terminals, the transistor 110 is turned on and a potential "L" is supplied to the node D. At this time, the transistor 104 is off.

Next, when a signal voltage "L" is input to the first input terminals, the transistor 110 is turned off and the potential "L" is retained in the node D. Next, also during a period in which a boosting operation is performed using a signal voltage input to the second input terminal, the potential "L" is retained in the node D.

Then, when a signal voltage "H" is input to the third input terminal, the transistor 109 is turned on, and the potential of the node D becomes "H". At this time, the transistor 104 is turned on, and the potential of the node A becomes "L".

When a signal voltage "L" is input to the third input terminal, the transistor 109 is turned off and the potential of the node D is retained at "H". This state is retained to the next frame; during that time, the transistor 104 is turned on, and the potential "L" of the wiring 122 is continuously supplied to the node A. Thus, the node A (the wiring 125) can be kept at a constant potential "L".

Note that in the case where an OS transistor is used as the transistor 102, owing to its extremely low off-state current, the potential increase in the wiring 125 is slight because the off-state current is extremely low. The structure including the circuit 15 can be applied to other circuits in this embodiment.

Operation Example of Modification Example 2

The circuit 13 illustrated in FIG. 3B can be operated in accordance with the timing chart illustrated in FIG. 2B. Even when the leakage current of the transistor 102 is relatively high, the potential of the node A can be kept constant also at and after time T6.

Modification Example 3 of Boosting Circuit

Figure 4:
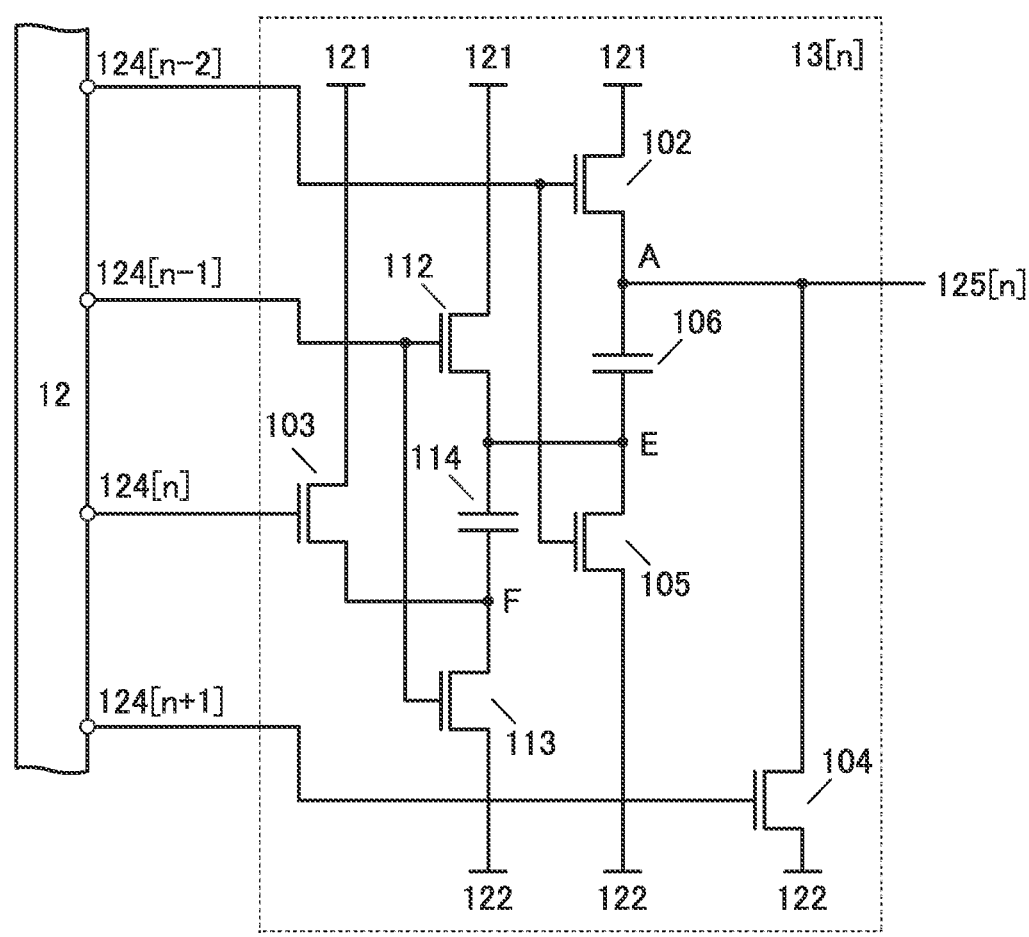
FIG. 4 is a diagram illustrating a boosting circuit.

FIG. 4 illustrates another modification example of the circuit 13. The above-described circuit 13 is an example of including three input terminals; however, the circuit 13 illustrated in FIG. 4 is an example of including four input terminals. In this structure, the boosting function can be increased more than that in the aforementioned circuit 13.

The circuit 13 illustrated in FIG. 4 has a structure in which a transistor 112, a transistor 113, and a capacitor 114 are added to the circuit 13 illustrated in FIG. 2A.

The one of the source and the drain of the transistor 102 is electrically connected to the one electrode of the capacitor 106. The one electrode of the capacitor 106 is electrically connected to the one of the source and the drain of the transistor 104.

The other electrode of the capacitor 106 is electrically connected to the one of the source and the drain of the transistor 105, one of a source and a drain of the transistor 112, and one electrode of the capacitor 114. The other electrode of the capacitor 114 is electrically connected to the one of the source and the drain of the transistor 103 and one of a source and a drain of the transistor 113.

The gate of the transistor 102 is electrically connected to a wiring 124[n−2]. A gate of the transistor 112 is electrically connected to the wiring 124[n−1]. A gate of the transistor 113 is electrically connected to the wiring 124[n−1]. The gate of the transistor 103 is electrically connected to the wiring 124[n]. The gate of the transistor 104 is electrically connected to the wiring 124[n+1]. The other of the source and the drain of the transistor 102 is electrically connected to the wiring 121. The other of the source and the drain of the transistor 103 is electrically connected to the wiring 121. The other of the source and the drain of the transistor 104 is electrically connected to the wiring 122. The other of the source and the drain of the transistor 105 is electrically connected to the wiring 122. The other of the source and the drain of the transistor 112 is electrically connected to the wiring 121. The other of the source and the drain of the transistor 113 is electrically connected to the wiring 122.

Here, a wiring to which the other electrode of the capacitor 106, the one of the source and the drain of the transistor 112, the one electrode of the capacitor 114, and the one of the source and the drain of the transistor 105 are connected is referred to as a node E. A wiring to which the other electrode of the capacitor 114, the one of the source and the drain of the transistor 103, and the one of the source and the drain of the transistor 113 are connected is referred to as a node F.

In the circuit 13 illustrated in FIG. 4, the gate of the transistor 102 and the gate of the transistor 105 to which the wiring 124[n−2] is connected function as the first input terminals. The gate of the transistor 112 and the gate of the transistor 113 to which the wiring 124[n−1] is connected function as the second input terminals. The gate of the transistor 103 to which the wiring 124[n] is connected functions as the third input terminal. A gate of the transistor 104 to which the wiring 124[n+1] is connected functions as a fourth input terminal.

Operation Example of Modification Example 3

Figure 5:
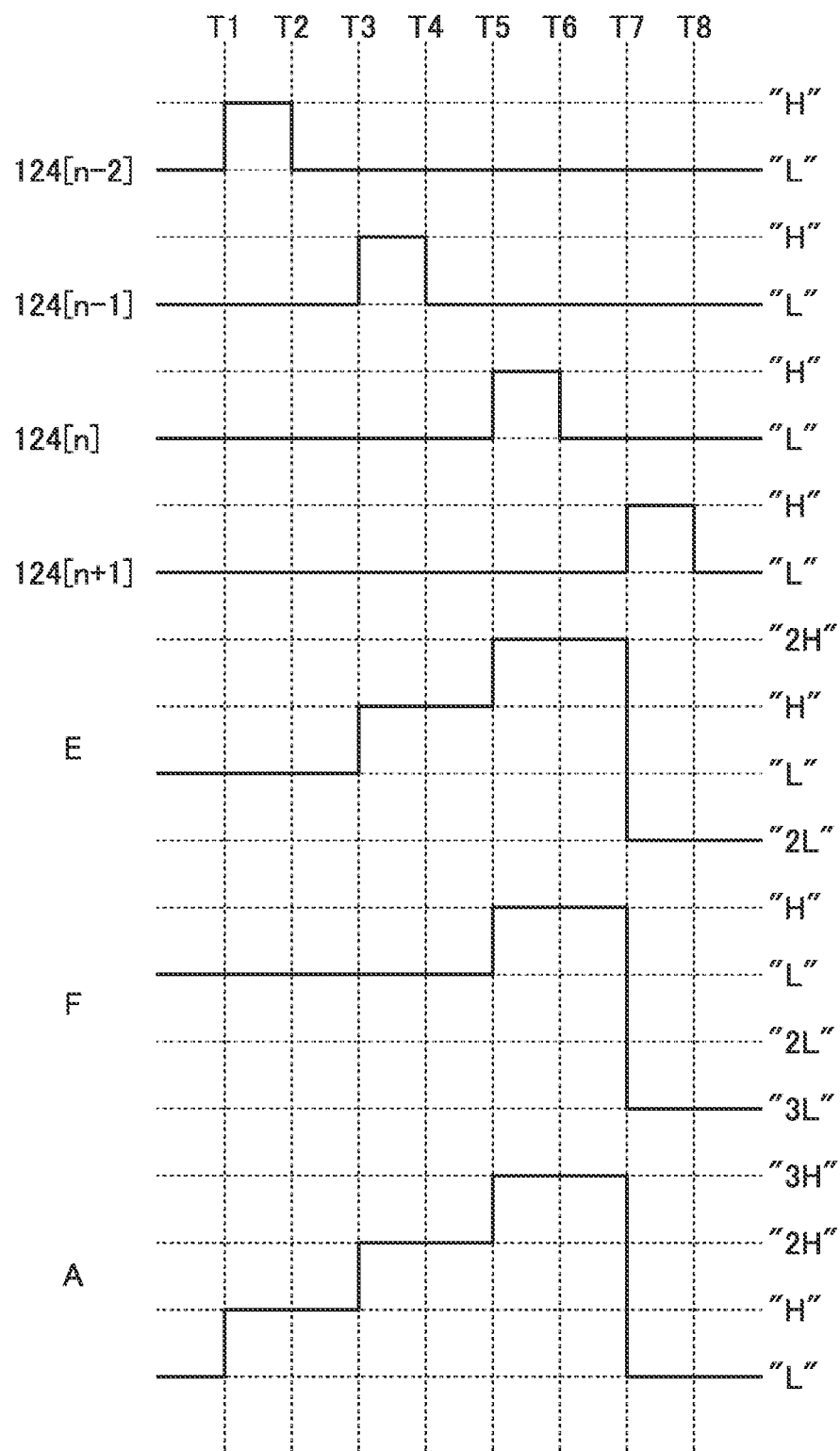
FIG. 5 is a timing chart illustrating the operation of the boosting circuit.

The basic operation of boosting is the same as that of the circuit 13 illustrated in FIG. 2A. An operation example of the circuit 13 illustrated in FIG. 4 is described with reference to the timing chart in FIG. 5. Note that the condition is such that the wiring 121 is supplied with "H", the wiring 122 is supplied with "L", and the wiring 124 is supplied with "H" or "L".

At time T1, when the potential of the wiring 124[n−2] becomes "H" (the potential of the wiring 124[n−1], the potential of the wiring 124[n], and the potential of the wiring 124[n+1] are "L"), the transistor 102 is turned on, and the potential of the node A becomes "H". In addition, the transistor 105 is turned on, and the potential of the node E becomes "L".

At time T2, when the potential of the wiring 124[n−2] becomes "L" (the potential of the wiring 124[n−1], the potential of the wiring 124[n], and the potential of the wiring 124[n+1] are "L"), the transistor 102 is turned off and the potential of the node A is retained at "H". In addition, the transistor 105 is turned off and the potential of the node E is retained at "L".

At time T3, when the potential of the wiring 124[n−1] becomes "H" (the potential of the wiring 124[n−2], the potential of the wiring 124[n], and the potential of the wiring 124[n+1] are "L"), the transistor 112 is turned on, and the potential of the node E changes from "L" to "H". Accordingly, the amount of change is added to the potential of the node A in accordance with the capacitance ratio of the capacitor 106 to the node A, whereby the potential of the node A becomes "H+(H−L)". In other words, when "L"=0, the potential of the node A becomes "2H". The transistor 113 is turned on, and the potential of the node F becomes "L".

At time T4, when the potential of the wiring 124[n−1] becomes "L" (the potential of the wiring 124[n−2], the potential of the wiring 124[n], and the potential of the wiring 124[n+1] are "L"), the transistor 112 is turned off and the potential of the node E is retained at "H". In addition, the transistor 113 is turned off and the potential of the node F is retained at "L".

At time T5, when the potential of the wiring 124[n] becomes "H" (the potential of the wiring 124[n−2], the potential of the wiring 124[n−1], and the potential of the wiring 124[n+1] are "L"), the transistor 103 is turned on and the potential of the node F changes from "L" to "H". The amount of change is added to the potential of the node A in accordance with the capacitance ratio of the capacitor 114 to the node E and that of the capacitor 114 to the node A, and the potential of the node A becomes "2H+(H−L)". In other words, when "L"=0, the potential of the node A becomes "3H".

At time T6, when the potential of the wiring 124[n] becomes "L" (the potential of the wiring 124[n−2], the potential of the wiring 124[n−1], and the potential of the wiring 124[n+1] are "L"), the transistor 103 is turned off and the potential of the node A is retained at "3H".

At time T7, when the potential of the wiring 124[n+1] becomes "H" (the potential of the wiring 124[n−2], the potential of the wiring 124[n−1], and the potential of the wiring 124[n] are "L"), the transistor 104 is turned off and the potential of the node A becomes "L".

At time T8, when the potential of the wiring 124[n+1] becomes "L" (the potential of the wiring 124[n−2], the potential of the wiring 124[n−1], and the potential of the wiring 124[n] are "L"), the transistor 104 is turned off and the potential of the node A is retained at "L".

The writing operation in the pixel 10 can be performed in a period during which the potential "3H" is supplied to the node A (the wiring 125 [n]) (at and after time T5 and before time T7). Since the potential of the node A is retained at "L" at and after T7, an image signal written to the pixel 10 can be retained to the next frame (next operation).

As described above, the boosting function can be enhanced by addition of the two transistors and one capacitor to the circuit 13 in FIG. 2A. The boosting function can be further enhanced by addition of the above-described structure.

Modification Example 4 of Boosting Circuit

Figure 6A:
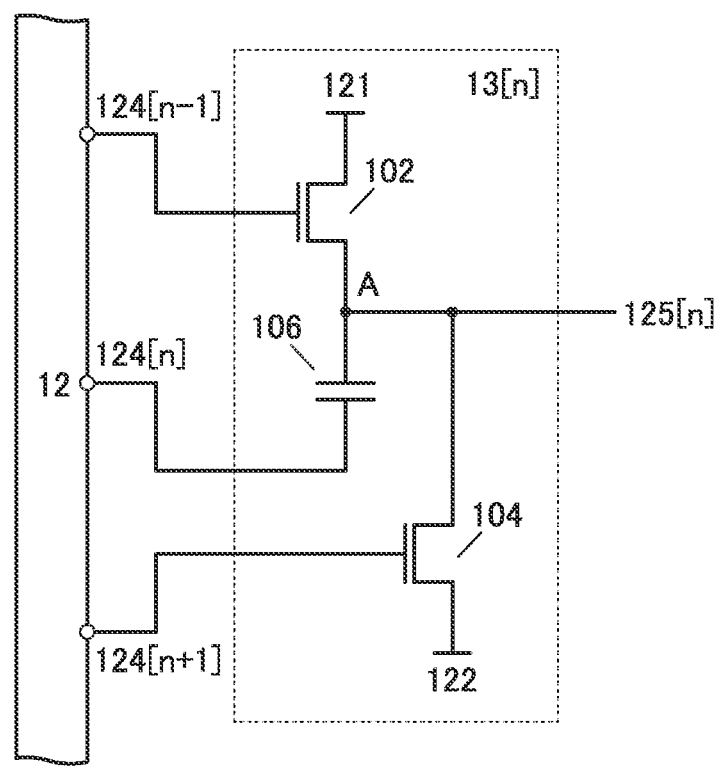
FIG. 6A is a diagram illustrating a boosting circuit.

FIG. 6A illustrates another modification example of the circuit 13. The circuit 13 illustrated in FIG. 6 has a simplified structure, in which the transistor 103 and the transistor 105 are omitted from the circuit 13 illustrated in FIG. 2A. In this structure, the wiring 124[n] is electrically connected to the other electrode of the capacitor 106. In other words, the other electrode of the capacitor 106 functions as the second input terminal.

Operation Example of Modification Example 4

The basic operation of boosting is the same as that of the circuit 13 illustrated in FIG. 2A. Since the transistor 103 is omitted, the boosting operation depends on a period during which a signal voltage "H" is input to the second input terminal.

Figure 6B:
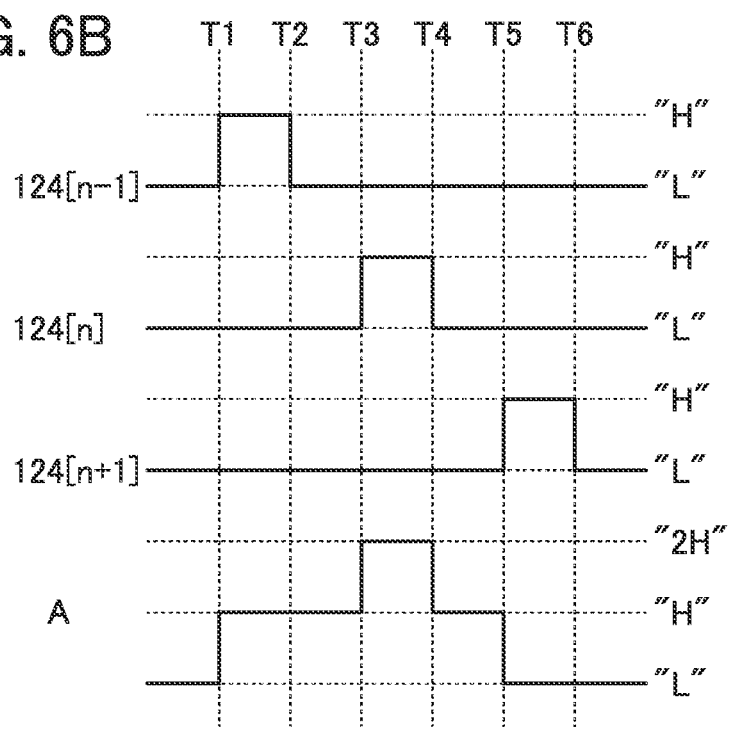
FIG. 6B is a timing chart illustrating the operation of the boosting circuit.

An operation example of the circuit 13 illustrated in FIG. 6A is described using the timing chart in FIG. 6B. In the description below and the timing chart, a low potential is represented by "L", and a high potential is represented by "H". In addition, the condition is such that the wiring 121 is supplied with "H", the wiring 122 is supplied with "L", and the wiring 124 is supplied with "H" or "L".

At time T1, when the potential of the wiring 124[n−1] becomes "H" (the potential of the wiring 124[n] and the potential of the wiring 124[n+1] are "L"), the transistor 102 is turned on, and the potential of the node A becomes "H". At this time, the other electrode of the capacitor 106 is supplied with the potential "L".

At time T2, when the potential of the wiring 124[n−1] becomes "L" (the potential of the wiring 124[n] and the potential of the wiring 124[n+1] are "L"), the transistor 102 is turned off, and the potential of the node A is retained at "H". At this time, the other electrode of the capacitor 106 is supplied with the potential "L".

At time T3, when the potential of the wiring 124[n] becomes "H" (the potential of the wiring 124[n−1] and the potential of the wiring 124[n+1] are "L"), the potential of the other electrode of the capacitor 106 changes from "L" to "H". The amount of change is added to the potential of the node A in accordance with the capacitance ratio of the capacitor 106 to the node A, whereby the potential of the node A becomes "H+(H−L)". That is, when "L"=0, the potential of the node A becomes "2H".

At time T4, when the potential of the wiring 124[n] becomes "L" (the potential of the wiring 124[n−1] and the potential of the wiring 124[n+1] are "L"), the potential of the other electrode of the capacitor 106 changes from "H" to "L". The amount of change is added to the potential of the node A in accordance with the capacitance ratio of the capacitor 106 to the node A, whereby the potential of the node A becomes "2H+(L−H)". That is, when "L"=0, the potential of the node A becomes "H". At time T5, when the potential of the wiring 124[n+1] becomes "H" (the potential of the wiring 124[n−1] and the potential of the wiring 124[n] are "L"), the transistor 104 is turned on, whereby the potential of the node A becomes "L".

At time T6, when the potential of the wiring 124[n+1] becomes "L" (the potential of the wiring 124[n−1] and the potential of the wiring 124[n] are "L"), the transistor 104 is turned off and the potential of the node A is retained at "L".

As described above, although the potential of the node A becomes "2H" at and after time T3, it returns to "H" at time T4. That is, a period during which a high potential can be kept is shorter than that in the circuit 13 described with reference to FIG. 2 to FIG. 6. The circuit 13 illustrated in FIG. 6A is preferably used for a display apparatus that can take sufficiently time to perform writing in a pixel even with such an operation.

Figure 7:
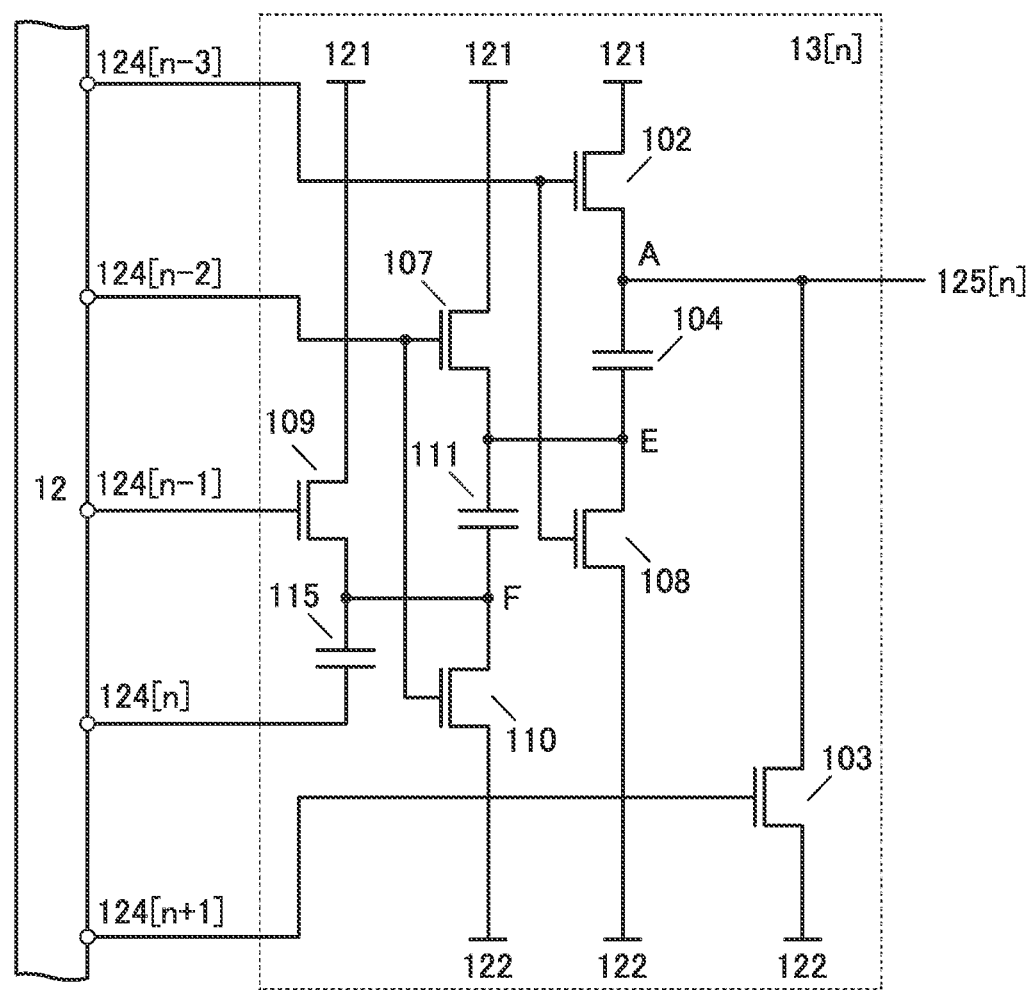
FIG. 7 is a diagram illustrating a boosting circuit.

Note that the same structure can also be applied to the circuit 13 by which a voltage can be boosted up to a higher level. FIG. 7 shows a structure in which another input terminal is added to the structure of the circuit 13 illustrated in FIG. 4. The circuit 13 of this structure can output a potential "4H" at the maximum. A difference from the circuit 13 illustrated in FIG. 4 is that a capacitor 115 is electrically connected to the node F. The capacitor 115 can be electrically connected to an input terminal in the last stage which performs a boosting operation.

<Another Mode of Boosting Circuit and Another Connection Mode of Boosting Circuit>

Figure 8A:
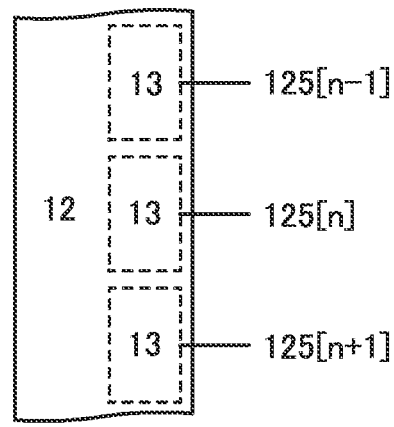
FIG. 8A to FIG. 8C are diagrams illustrating other modes of the boosting circuit and other connection modes of the boosting circuit.

Although the structures in each of which the circuit 13 is connected to an output terminal of the gate driver 12 are described in FIG. 1 to FIG. 7, the circuit 13 may be a component of the gate driver 12 as illustrated in FIG. 8A. With this structure, boosting is performed inside the gate driver 12. Alternatively, the circuit 13 may be stacked with a circuit such as a shift register included in the gate driver 12. The frame of a display apparatus can be narrowed by stacking these layers.

Figure 8B:
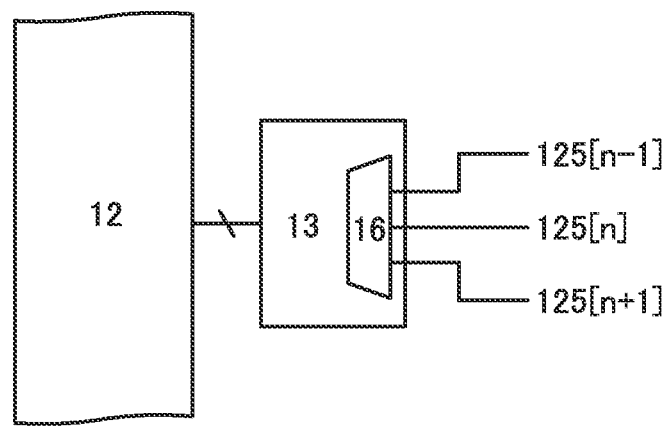

As illustrated in FIG. 8B, a structure in which a selection circuit 16 is provided in the circuit 13 may be employed. The selection circuit 16 can output an output potential that is boosted in the circuit 13 to a selected wiring 125. With such a structure, the number of circuits 13 provided in a display apparatus can be reduced, and the frame of the display apparatus can be narrowed. Note that a structure may be such that the selection circuit 16 is provided outside the circuit 13 and is electrically connected to an output terminal of the circuit 13.

Figure 8C:
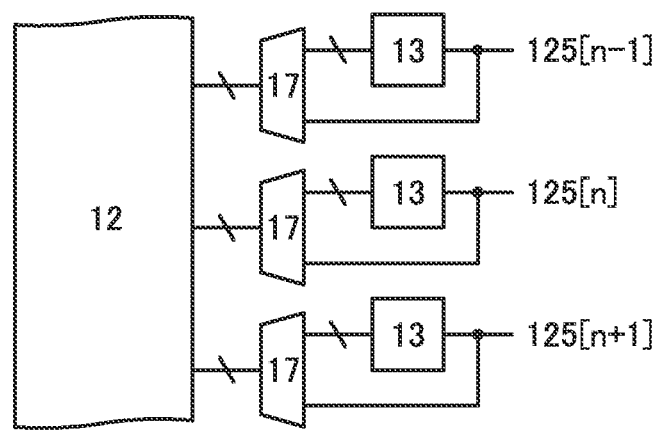

As illustrated in FIG. 8C, a structure may be employed in which a selection circuit 17 is provided between the gate driver 12 and the circuit 13. The selection circuit 17 can select a first path through which a signal voltage output from the gate driver 12 is output to the circuit 13 or a second path which bypasses the circuit 13 and through which a signal voltage is output to the pixel 10. With such a structure, a signal voltage which has not been boosted can be supplied to the pixel, allowing the display apparatus to be switched to a power saving operation such as suppressing display luminance.

<Pixel Circuit>

Figure 9A:
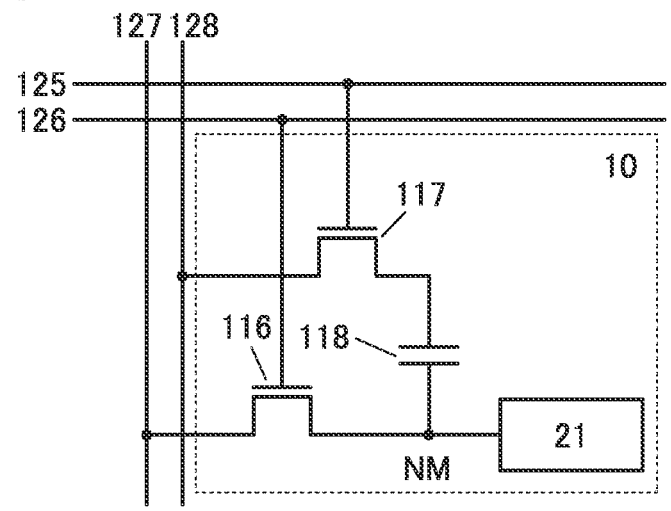
FIG. 9A and FIG. 9B are diagrams each illustrating a pixel circuit.

The pixel 10 may have a structure illustrated in FIG. 9A besides the structure illustrated in FIG. 2. The pixel 10 in FIG. 9A has a function of boosting input data voltage. The pixel 10 illustrated in FIG. 9A includes a transistor 116, a transistor 117, a capacitor 118, and the circuit 21; two gate lines (the wiring 125 and a wiring 126) and two source lines (the wiring 127 and a wiring 128) are electrically connected. The wiring 125 and the wiring 126 are electrically connected to different circuits 13.

A gate of the transistor 116 is electrically connected to the wiring 126, one of a source and a drain of the transistor 116 is electrically connected to the wiring 127, and the other of the source and the drain of the transistor 116 is electrically connected to one electrode of the capacitor 118 and the circuit 21. A gate of the transistor 117 is electrically connected to the wiring 125, one of a source and a drain of the transistor 117 is electrically connected to the wiring 128, and the other of the source and the drain of the transistor 117 is electrically connected to the other electrode of the capacitor 118.

The transistor 116 is controlled by a signal supplied to the wiring 126, whereas the transistor 117 is controlled by a signal supplied to the wiring 125.

The pixel 10 illustrated in FIG. 9A is effective in the case where a high voltage is supplied to the display device included in the circuit 21. The boosting function of the pixel 10 is described below. Note that in the pixel 10 illustrated in FIG. 9A, a wiring connecting the other of the source and the drain of the transistor 116, the one electrode of the capacitor 118, and the circuit 21 is referred to as a node NM.

First, a potential "D1" of the wiring 127 is supplied to the node NM through the transistor 116 and, at overlapping timings, a reference potential "$V_{ref}$" is supplied from the wiring 128 to the other electrode of the capacitor 118 through the transistor 117. At this time, "D1−$V_{ref}$" is retained in the capacitor 118. Next, with the node NM floating, the potential of the wiring 128, "D2", is supplied to the other electrode of the capacitor 118 through the transistor 117. Here, the potential "D2" is a potential for addition.

At this time, when the capacitance value of the capacitor 118 is $C_{118}$ and the capacitance value of the node NM is $C_{NM}$, the potential of the node NM becomes D1+($C_{118}$/($C_{118}$+$C_{NM}$))×(D2−$V_{ref}$). Here, assuming that the value of $C_{118}$ is sufficiently higher than that of $C_{NM}$, $C_{118}$/($C_{118}$+$C_{NM}$) approximates one. Thus, it can be said that the potential of the node NM approximates "D1+(D2−$V_{ref}$)". When D1=D2 and $V_{ref}$=0, "D1+(D2−$V_{ref}$)"="2D1".

That is, when the circuit is designed appropriately, a potential approximately twice as high as the potential that can be input from the wiring 125 or the wiring 126 can be supplied to the node NM.

By such an action, a high voltage can be supplied to the display device. Thus, even with use of general types of a driver IC, a display device with a high threshold voltage can be operated. Alternatively, power consumption of the driver IC can be reduced.

Figure 9B:
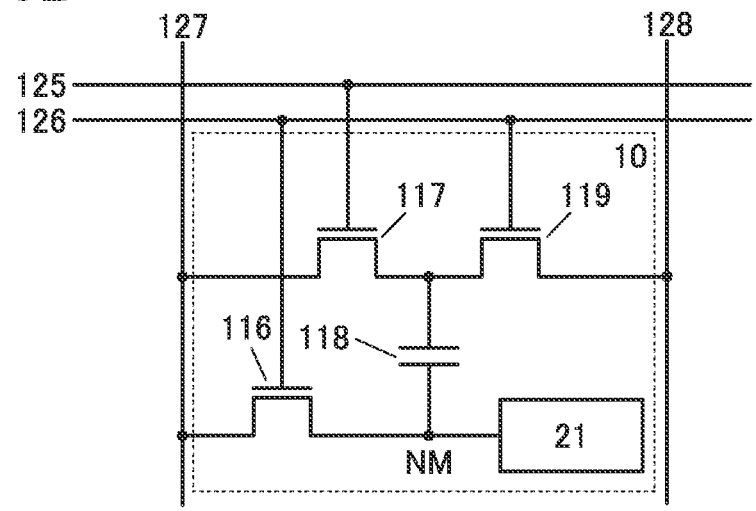

The pixel 10 may have the structure illustrated in FIG. 9B. The pixel 10 illustrated in FIG. 9B is different from the pixel 10 illustrated in FIG. 9A in that the transistor 119 is included. A gate of the transistor 119 is electrically connected to the wiring 126, one of a source and a drain of the transistor 119 is electrically connected to the other of the source and the drain of the transistor 117 and the other electrode of the capacitor 118, and the other of the source and the drain of the transistor 119 is electrically connected to the wiring 128. The one of the source and the drain of the transistor 117 is connected to the wiring 127.

As described above, in the pixel 10 illustrated in FIG. 9A, the operation is performed such that the reference potential and the potential for addition are supplied to the other electrode of the capacitor 118 through the transistor 117. In this case, the two wirings 125 and 126 are needed and the reference potential and the potential for addition need to be alternately rewritten in the wiring 128, leading to a problem in a high-speed operation and power consumption.

Although the transistor 119 is added to the pixel 10 illustrated in FIG. 9B, the number of wirings is not increased because the gate of the transistor 119 can be connected to the wiring 126. In addition, the wiring 128 can be a dedicated wiring to which the reference potential is supplied, so that the reference potential and the potential for addition are not alternately rewritten in one wiring. Thus, this structure is suitable for a high-speed operation and low power consumption. As the wiring 128, a low-potential line connected to the circuit 21, or the like can be used, and thus the number of wirings can be reduced substantially.

Note that in FIG. 9A and FIG. 9B, an inverted potential of "D1", "D1B", may be used as "$V_{ref}$". In this case, a potential approximately three times as high as the potential that can be input from the wiring 125 or the wiring 126 can be supplied to the node NM. Note that the inverted potential means a potential where the absolute value of the difference from a reference potential is the same as that of the original potential and which is a different from the original potential. When the original potential, the inverted potential, and the reference potential are referred to as "D1", "D1B", and $V_{ref}$, respectively, the relation of $V_{ref}$=(D1+D1B)/2 is established.

<Circuit 21>

FIG. 10A to FIG. 10D each illustrate an example of a structure including a liquid crystal device as the display device, which can be applied to the circuit 21.

Figure 10A:
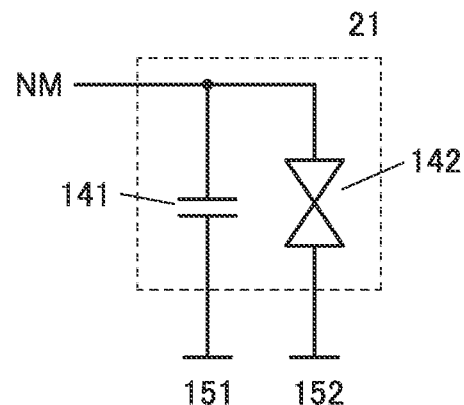
FIG. 10A to FIG. 10D are diagrams each illustrating a circuit including a display device.

The structure illustrated in FIG. 10A includes a capacitor 141 and a liquid crystal device 142. One electrode of the liquid crystal device 142 is electrically connected to one electrode of the capacitor 141. The one electrode of the capacitor 141 is electrically connected to the node NM.

The other electrode of the capacitor 141 is electrically connected to a wiring 151. The other electrode of the liquid crystal device 142 is electrically connected to a wiring 152. The wirings 151 and 152 each have a function of supplying power. For example, the wirings 151 and 152 are capable of supplying a reference potential such as GND or 0 V, or a given potential.

Figure 10B:
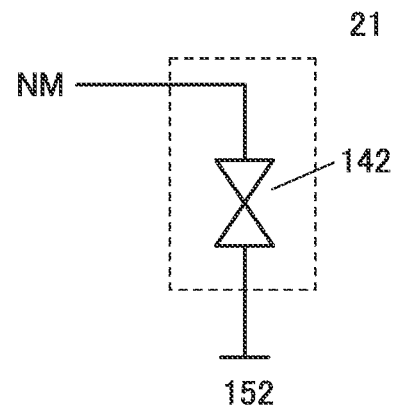

Note that a structure in which the capacitor 141 is omitted may be employed as illustrated in FIG. 10B. As described above, an OS transistor can be used as the transistor connected to the node NM. Since an OS transistor has an extremely low leakage current, display can be maintained for a comparatively long time even when the capacitor 141 functioning as a storage capacitor is omitted. In addition, regardless of the structure of the transistor, omitting the capacitor 141 is effective also in the case where a display period can be shortened by a high-speed operation, as in field-sequential driving. The aperture ratio can be improved by omitting the capacitor 141. Alternatively, the transmittance of the pixel can be improved.

In the structure of FIG. 10A and FIG. 10B, the operation of the liquid crystal device 142 starts when the potential of the node NM becomes higher than or equal to an operation threshold value of the liquid crystal device 142. Therefore, there is a case where a display operation starts before the potential of the node NM is determined. However, in the case of a transmissive liquid crystal display apparatus, even when an unnecessary display operation is performed, visual recognition can be inhibited by performing the operation of turning off a backlight until the potential of the node NM is determined.

Figure 10C:
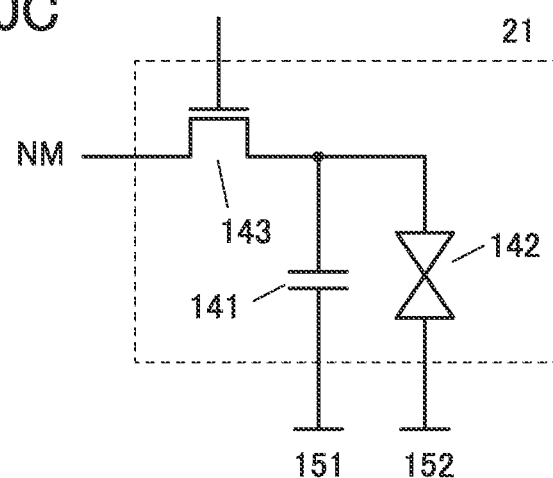

FIG. 10C illustrates a structure in which a transistor 143 is added to the structure of FIG. 10A. One of a source and a drain of the transistor 143 is electrically connected to the one electrode of the capacitor 141. The other of the source and the drain of the transistor 143 is electrically connected to the node NM.

In this structure, the potential of the node NM is applied to the liquid crystal device 142 when the transistor 143 is brought into conduction. Thus, the operation of the liquid crystal device 142 can be started at given timing after the potential of the node NM is determined.

Figure 10D:
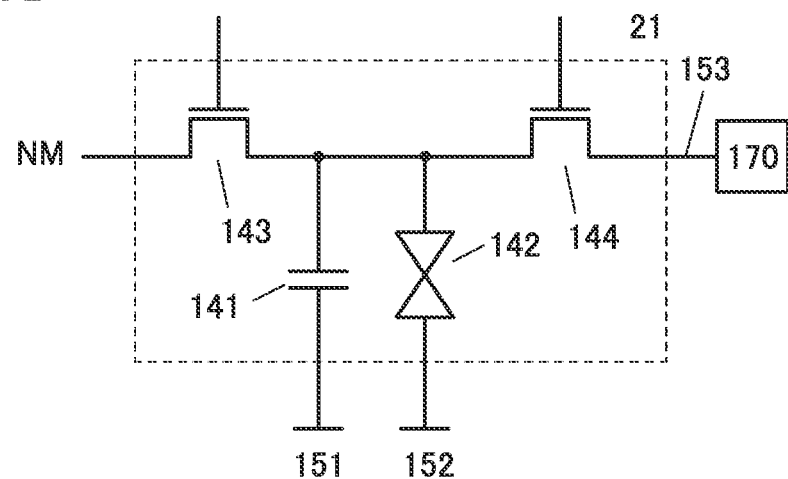

FIG. 10D illustrates a structure in which a transistor 144 is added to the structure of FIG. 10C. One of a source and a drain of the transistor 144 is electrically connected to the one electrode of the liquid crystal device 142. The other of the source and the drain of the transistor 144 is electrically connected to a wiring 153.

A circuit 170 electrically connected to the wiring 153 can have a function of resetting the potential supplied to the capacitor 141 and the liquid crystal device 142. FIG. 11A to FIG. 11D each illustrate an example of a structure including a light-emitting device as the display device, which can be applied to the circuit 21.

Figure 11A:
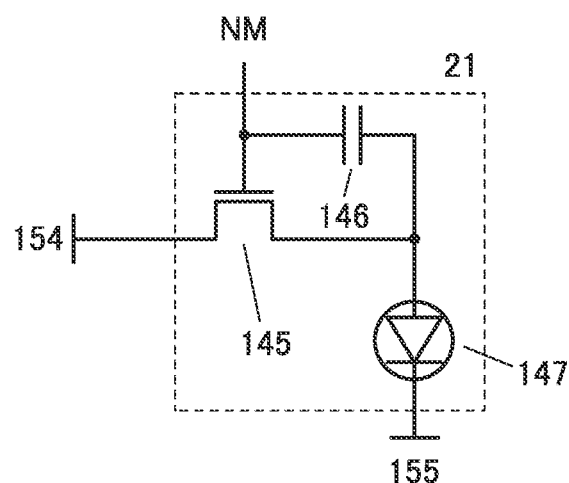
FIG. 11A to FIG. 11D are diagrams each illustrating a circuit including a display device.

The structure illustrated in FIG. 11A includes a transistor 145, a capacitor 146, and a light-emitting device 147. One of a source and a drain of the transistor 145 is electrically connected to one electrode of the light-emitting device 147. The one electrode of the light-emitting device 147 is electrically connected to one electrode of the capacitor 146. The other electrode of the capacitor 146 is electrically connected to a gate of the transistor 145. The gate of the transistor 145 is electrically connected to the node NM.

The other of the source and the drain of the transistor 145 is electrically connected to a wiring 154. The other electrode of the light-emitting device 147 is electrically connected to a wiring 155. The wirings 154 and 155 each have a function of supplying power. For example, the wiring 154 is capable of supplying a high potential power. The wiring 155 is capable of supplying a low potential power.

In the structure illustrated in FIG. 11A, current flows through the light-emitting device 147 when the potential of the node NM becomes higher than or equal to the threshold voltage of the transistor 145.

Figure 11B:
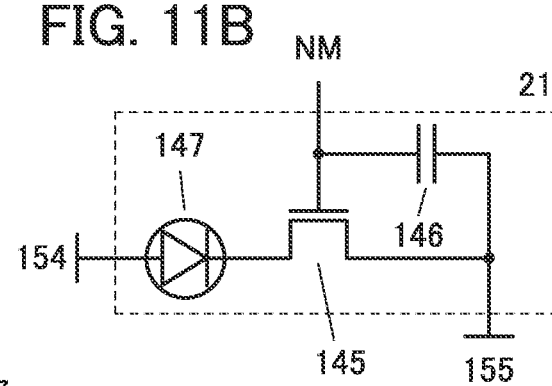

Alternatively, as illustrated in FIG. 11B, the one electrode of the light-emitting device 147 may be electrically connected to the wiring 154, and the other electrode of the light-emitting device 147 may be electrically connected to the other of the source and the drain of the transistor 145. This structure can also be applied to the other circuits 21 each including the light-emitting device 147.

Figure 11C:
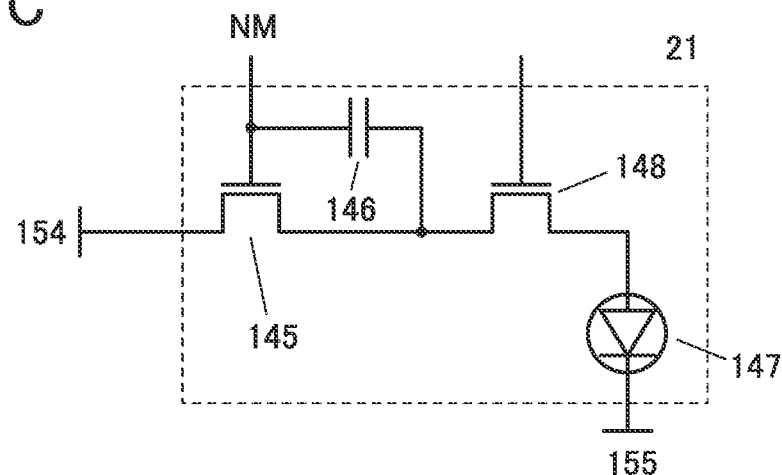
Figure 15A:
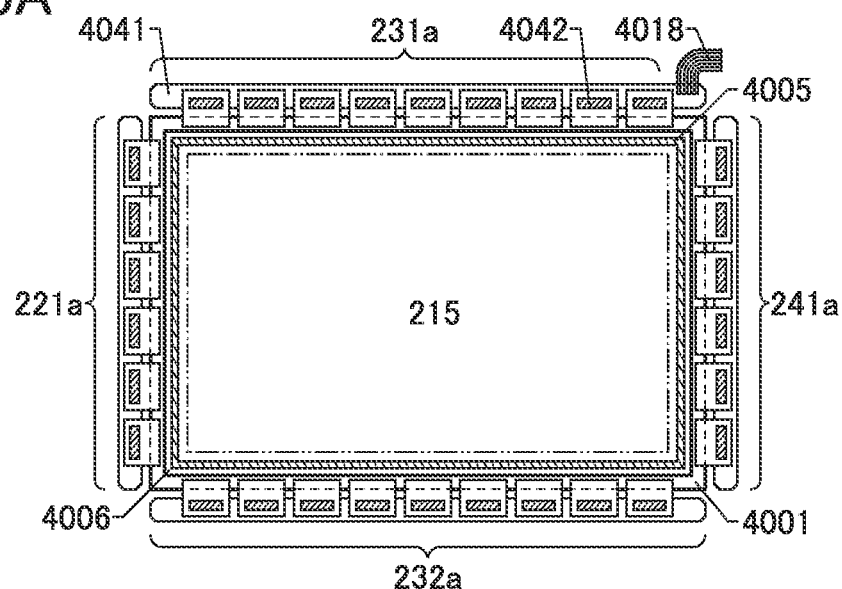
FIG. 15A to FIG. 15C are diagrams each illustrating a display apparatus.

FIG. 11C illustrates a structure in which a transistor 148 is added to the structure of FIG. 15A. One of a source and a drain of the transistor 148 is electrically connected to the one of the source and the drain of the transistor 145. The other of the source and the drain of the transistor 148 is electrically connected to the light-emitting device 147.

In this structure, current flows through the light-emitting device 147 when the potential of the node NM is higher than or equal to the threshold voltage of the transistor 145 and the transistor 148 is brought into conduction. Thus, light emission of the light-emitting device 147 can be started at given timing after the potential of the node NM is determined.

Figure 11D:
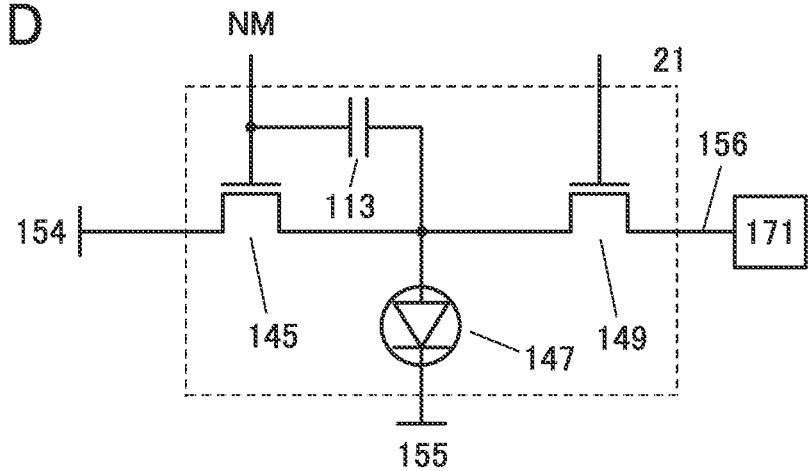

FIG. 11D is a structure in which a transistor 149 is added to the structure of FIG. 11A. One of a source and a drain of the transistor 149 is electrically connected to the one of the source and the drain of the transistor 145. The other of the source and the drain of the transistor 149 is electrically connected to a wiring 156.

The wiring 156 can be electrically connected to a supply source of a certain potential such as a reference potential. Supplying a certain potential from the wiring 156 to the one of the source and the drain of the transistor 145 enables stable writing of image data. Furthermore, timing of light emission of the light-emitting device 147 can be controlled.

In addition, the wiring 156 can be connected to a circuit 171 and can also have a function of a monitor line. The circuit 171 can have one or more of a function of the supply source of a certain potential, a function of obtaining electrical characteristics of the transistor 145, and a function of generating correction data.

Modification Example of Transistor

Figure 12:
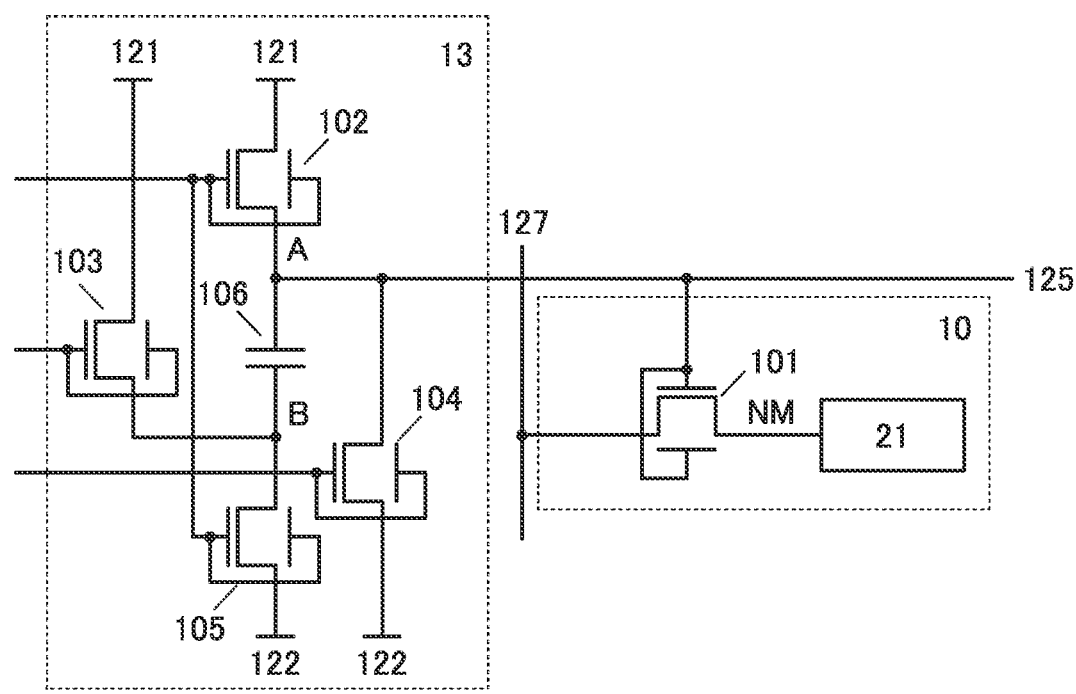
FIG. 12 is a diagram illustrating another mode of transistors.

As illustrated in FIG. 12, a transistor provided with a back gate may be used in a circuit of one embodiment of the present invention. FIG. 12 shows a structure in which back gates are electrically connected to front gates, which has an effect of increasing on-state current. Alternatively, a structure in which the back gates are electrically connected to wirings capable of supplying a constant potential may be employed. This structure enables control of the threshold voltages of the transistors. The transistors included in the circuit 21 may also have back gates.

<Simulation Result>

Figure 13:
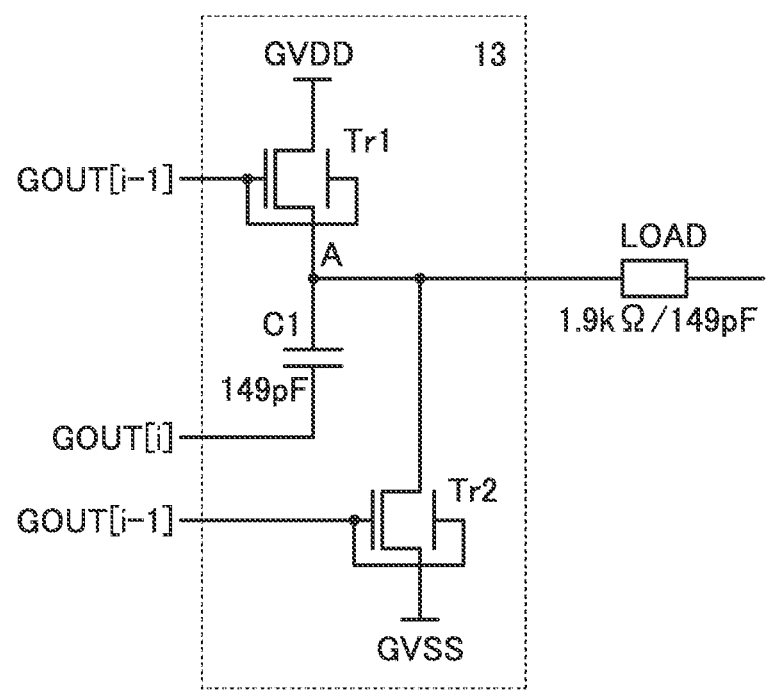
FIG. 13 is a diagram illustrating a circuit used for simulation.

Next, simulation results of pixel operations are described. FIG. 13 illustrates a structure of the pixel 10 used in the simulation. In the simulation, the circuit structure illustrated in FIG. 6A was used, and the operation illustrated in the timing chart of FIG. 6B was of interest.

Parameters used in the simulation were as follows. The transistor size was L/W=3 μm/1600 μm (transistors Tr1 and Tr2); the capacitance value of a capacitor C1 was 149 pF; and the capacitance value and the resistance of a load connected to the node A, on the assumption of about 9-inch diagonal vertical panel, were 149 pF and 1.9 kΩ, respectively. Power supply voltages input to the circuit 13 were set to GVDD=+11 V and GVSS=−21 V. Furthermore, input voltages from the gate driver (GOUT) were −21 V as "L", and +11 V as "H". Note that SPICE was used as circuit simulation software.

Figure 14:
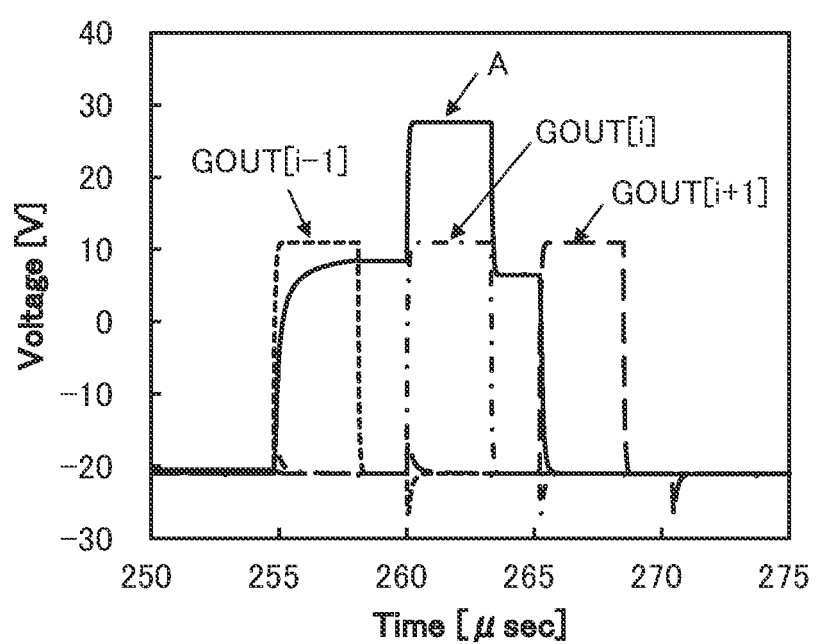
FIG. 14 is a diagram showing simulation results.

FIG. 14 shows simulation results. The horizontal axis represents time (usec) and the vertical axis represents a voltage (V) of the node A in the pixel 10. Note that GOUT[i−1] is a signal voltage input to a gate of the transistor Tr1, GOUT[i] is a signal voltage input to the capacitor C1, and GOUT[i+1] is a signal voltage input to a gate of the transistor Tr2.

As illustrated in FIG. 14, it was found that the potential of the node A is increased from the initial state where GVSS is input, −21 V, to approximately 8.4 V by the input of GOUT[i−1], increased to approximately 27.6 V by the input of GOUT[i], and returns to 21 V by the input of GOUT[i+1]. It was also observed that, with reference to the initial state, the output voltage when GOUT[i] is input can be increased approximately 1.65 times as high as the output voltage when GOUT[i−1] is input. A more appropriate design enables boosting characteristics to be improved more.

The above simulation results confirmed the effect of one embodiment of the present invention.

This embodiment can be implemented in combination with any of the structures described in the other embodiments and the like, as appropriate.

Embodiment 2

In this embodiment, a structure example of a display apparatus using a liquid crystal device and a structure example of a display apparatus using a light-emitting device are described. Note that the description of the components, operations, and functions of the display apparatus described in Embodiment 1 is omitted in this embodiment.

The pixel described in Embodiment 1 can be used in the display apparatus described in this embodiment. Note that a scan line driver circuit and a signal line driver circuit which are described below correspond to the gate driver and the source driver, respectively.

Figure 15B:
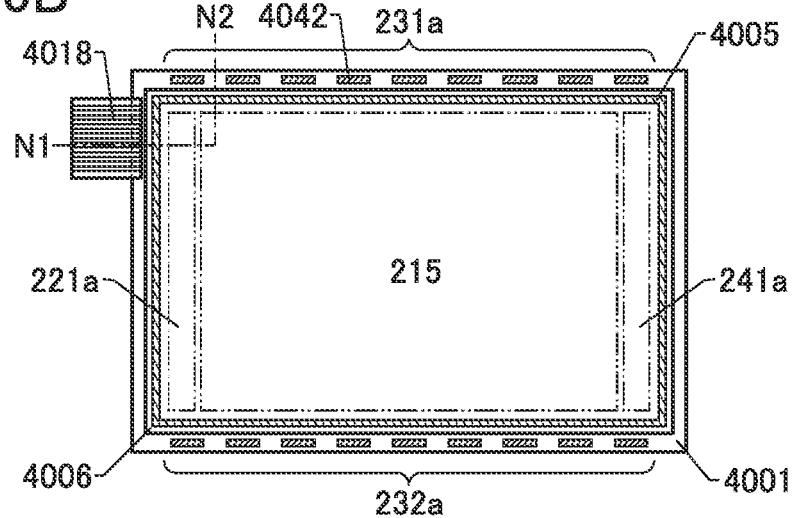
Figure 15C:
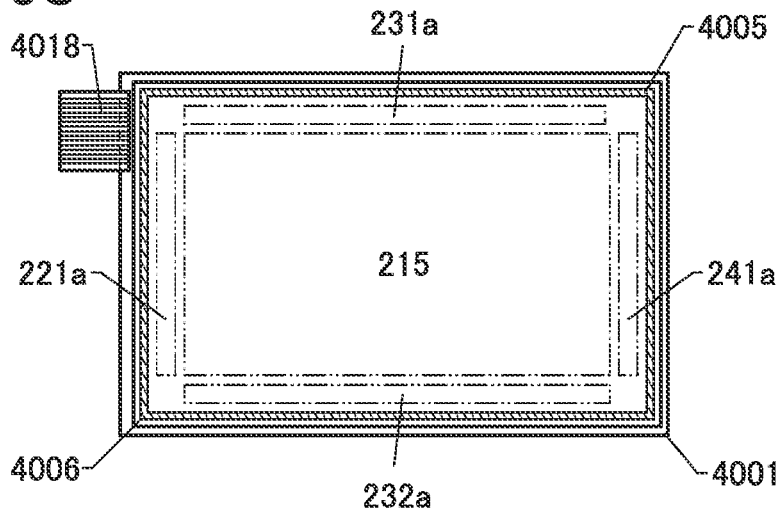

FIG. 15A to FIG. 15C are diagrams each illustrating a structure of a display apparatus in which one embodiment of the present invention can be used.

In FIG. 15A, a sealant 4005 is provided to surround a display portion 215 provided over a first substrate 4001, and the display portion 215 is sealed with the sealant 4005 and a second substrate 4006.

In FIG. 15A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 151, 152, 154, 155, and the like described in Embodiment 1.

Various signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF (Chip On Film) method, a COG (Chip On Glass) method, a TCP (Tape Carrier Package) method, or the like can be used.

FIG. 15B illustrates an example in which the integrated circuits 4042 included in the signal line driver circuit 231a and the signal line driver circuit 232a are mounted by a COG method. Some or all of the driver circuits can be integrated over the same substrate as the display portion 215, whereby a system-on-panel can be formed.

In the example illustrated in FIG. 15B, the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 15B, the sealant 4005 is provided to surround the display portion 215, the scan line driver circuit 221a, and the common line driver circuit 241a which are provided over the first substrate 4001. The second substrate 4006 is provided over the display portion 215, the scan line driver circuit 221a, and the common line driver circuit 241a. Thus, the display portion 215, the scan line driver circuit 221a, and the common line driver circuit 241a are sealed with a display device with the use of the first substrate 4001, the sealant 4005, and the second substrate 4006.

Although the signal line driver circuit 231a and the signal line driver circuit 232a are separately formed and mounted on the first substrate 4001 in the example illustrated in FIG. 15B, one embodiment of the present invention is not limited to this structure. The scan line driver circuit may be separately formed and then mounted, and part of the signal line driver circuits or part of the scan line driver circuits may be separately formed and then mounted. The signal line driver circuit 231a and the signal line driver circuit 232a may be formed over the same substrate as the display portion 215, as illustrated in FIG. 15C.

In some cases, the display apparatus include a panel in which the display device is sealed, and a module in which an IC or the like including a controller is mounted on the panel.

The display portion and the scan line driver circuit provided over the first substrate each include a plurality of transistors. As the transistors, the Si transistor or the OS transistor described in Embodiment 1 can be used.

The structure of the transistors included in the peripheral driver circuit may be the same as or different from the structure of the transistors included in the pixel circuits of the display portion. The transistors included in the peripheral driver circuit may have the same structure, or may have two or more kinds of structures. Similarly, the transistors included in the pixel circuits may have the same structure, or may have two or more kinds of structures.

An input device 4200 can be provided over the second substrate 4006. A structure where the display device illustrated in FIG. 15A to FIG. 15C is provided with the input device 4200 can function as a touch panel.

There is no particular limitation on a sensor device (also referred to as a sensor element) included in the touch panel of one embodiment of the present invention. A variety of sensors capable of sensing an approach or a contact of a sensing target such as a finger or a stylus can be used as the sensor device.

It is possible to use a sensor of any of a variety of types such as a capacitive type, a resistive type, a surface acoustic wave type, an infrared type, an optical type, and a pressure-sensitive type.

In this embodiment, a touch panel including a capacitive-type sensor device is described as an example.

Examples of the capacitive type include a surface capacitive type and a projected capacitive type. Examples of the projected capacitive type include a self-capacitive type and a mutual capacitive type. The use of a mutual capacitive type is preferred because multiple points can be sensed simultaneously.

The touch panel of one embodiment of the present invention can have any of a variety of structures, including a structure in which a display apparatus and a sensor device that are separately formed are attached to each other and a structure in which an electrode and the like included in a sensor device are provided on one or both of a substrate supporting a display device and a counter substrate.

Figure 16A:
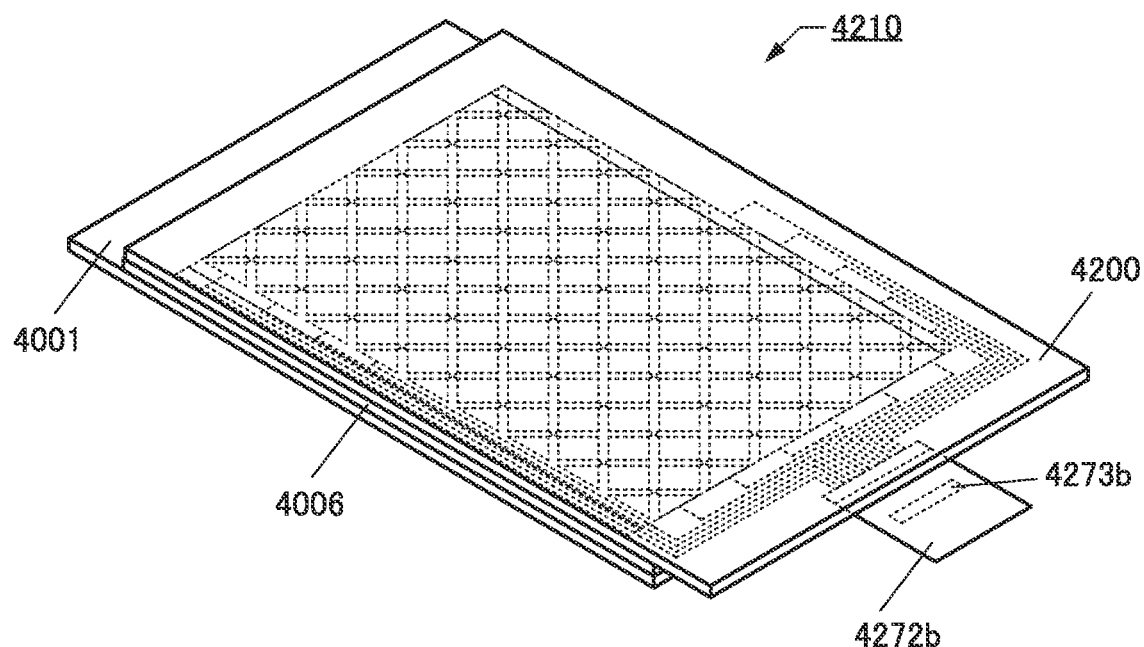
FIG. 16A and FIG. 16B are diagrams illustrating a touch panel.
Figure 16B:
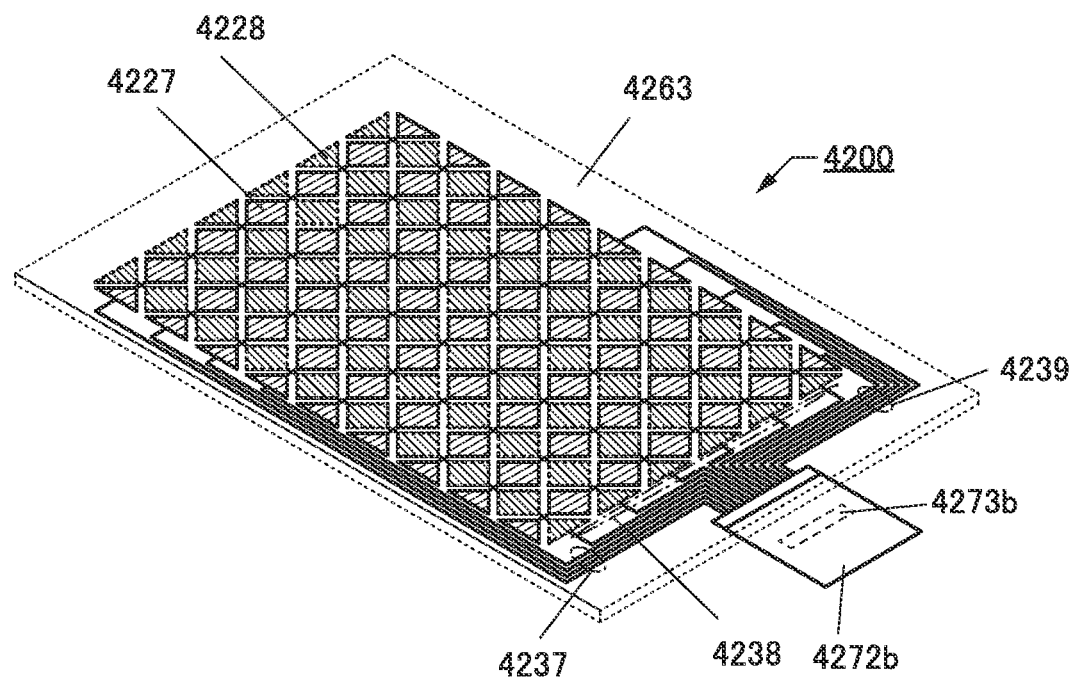

FIG. 16A and FIG. 16B illustrate an example of the touch panel. FIG. 16A is a perspective view of a touch panel 4210.

FIG. 16B is a schematic perspective view of the input device 4200. Note that for clarity, only typical components are illustrated.

The touch panel 4210 has a structure in which a display apparatus and a sensor device that are separately formed are attached to each other.

The touch panel 4210 includes the input device 4200 and the display apparatus, which are provided to overlap with each other.

The input device 4200 includes a substrate 4263, an electrode 4227, an electrode 4228, a plurality of wirings 4237, a plurality of wirings 4238, and a plurality of wirings 4239. For example, the electrode 4227 can be electrically connected to the wiring 4237 or the wiring 4239. In addition, the electrode 4228 can be electrically connected to the wiring 4239. An FPC 4272b is electrically connected to each of the plurality of wirings 4237 and the wirings 4238. An IC 4273b can be provided for the FPC 4272b.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be used.

FIG. 17A and FIG. 17B are cross-sectional views of a portion indicated by a chain line N1–N2 in FIG. 15B. The display apparatus illustrated in FIG. 17A and FIG. 17B each include an electrode 4015, and the electrode 4015 is electrically connected to a terminal included in the FPC 4018 through an anisotropic conductive layer 4019. In FIG. 17A and FIG. 17B, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221a provided over the first substrate 4001 each include a plurality of transistors. In FIG. 17A and FIG. 17B, the transistor 4010 included in the display portion 215 and the transistor 4011 included in the scan line driver circuit 221a are illustrated as examples. Note that in the examples illustrated in FIG. 17A and FIG. 17B, the transistor 4010 and the transistor 4011 are bottom-gate transistors but may be top-gate transistors.

In FIG. 17A and FIG. 17B, the insulating layer 4112 is provided over the transistor 4010 and the transistor 4011. In FIG. 17B, a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display apparatuses illustrated in FIG. 17A and FIG. 17B each include a capacitor 4020. In the example shown here, the capacitor 4020 includes an electrode 4021 formed in the same step as a gate electrode of the transistor 4010, an insulating layer 4103, and an electrode formed in the same step as the source electrode and the drain electrode. The capacitor 4020 is not limited to having this structure and may be formed using another conductive layer and another insulating layer.

The transistor 4010 provided in the display portion 215 is electrically connected to the display device. FIG. 17A illustrates an example of a liquid crystal display apparatus using a liquid crystal device as the display device. In FIG. 17A, a liquid crystal device 4013 serving as the display device includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal device having a variety of modes can be used as the liquid crystal device 4013. For example, a liquid crystal device using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (Anti-Ferroelectric Liquid Crystal) mode, an ECB (Electrically Controlled Birefringence) mode, a VA-IPS mode, a guest-host mode, or the like can be used.

As the liquid crystal display apparatus described in this embodiment, a normally black liquid crystal display apparatus such as a transmissive liquid crystal display apparatus employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal device is a device that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal device, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although an example of a liquid crystal display apparatus including a liquid crystal device with a vertical electric field mode is illustrated in FIG. 17A, one embodiment of the present invention can be applied to a liquid crystal display apparatus including a liquid crystal device with a horizontal electric field mode. In the case of employing a horizontal electric field mode, liquid crystal exhibiting a blue phase for which an alignment film is not used may be used. The blue phase is one of liquid crystal phases, which appears just before a cholesteric phase changes into an isotropic phase while the temperature of cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains liquid crystal exhibiting a blue phase and a chiral material has a short response speed and exhibits optical isotropy. In addition, the liquid crystal composition containing liquid crystal exhibiting a blue phase and a chiral material does not need alignment treatment and has small viewing angle dependence. Since an alignment film does not need to be provided and rubbing treatment is unnecessary, electrostatic breakdown caused by the rubbing treatment can be prevented and defects or damage of the liquid crystal display apparatus in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display apparatus illustrated in FIG. 17A, a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material for the coloring layer can also be used for the light-blocking layer. For example, a stacked-layer structure of a film containing a material used for a coloring layer which transmits light of a certain color and a film containing a material used for a coloring layer which transmits light of another color can be employed. It is preferable that the coloring layer and the light-blocking layer be formed using the same material because the same apparatus can be used and the process can be simplified.

Examples of a material that can be used for the coloring layer include a metal material, a resin material, and a resin material containing a pigment or a dye. The light-blocking layer and the coloring layer can be formed by, for example, an inkjet method or the like.

The display apparatuses illustrated in FIG. 17A and FIG. 17B each include the insulating layer 4111 and an insulating layer 4104. As the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting device can be used as the display device included in the display apparatus. As the light-emitting device, for example, an EL device that utilizes electroluminescence can be used. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and a light-emitting compound contained in the EL layer emits light.

As the EL device, an organic EL device or an inorganic EL device can be used, for example. Note that an LED (including a micro LED) that uses a compound semiconductor as a light-emitting material can also be used.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is positioned between dielectric layers, which are further positioned between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

FIG. 17B illustrates an example of a light-emitting display apparatus using a light-emitting device as a display device (also referred to as an "EL display apparatus"). A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, this embodiment is not limited to this structure. The structure of the light-emitting device 4513 can be changed as appropriate depending on the direction in which light is extracted from the light-emitting device 4513, or the like.

The partition wall 4510 is formed using an organic insulating material or an inorganic insulating material. It is particularly preferable that the partition wall 4510 be formed using a photosensitive resin material to have an opening portion over the first electrode layer 4030 such that a side surface of the opening portion slopes with continuous curvature.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a color display method, there are a method in which the light-emitting device 4513 that emits white light is combined with a coloring layer and a method in which the light-emitting device 4513 that emits light of a different emission color is provided in each pixel. The former method is more productive than the latter method. The latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting device be packaged (sealed) with a protective film (such as a laminate film or an ultraviolet curable resin film) or a cover member with high air-tightness and little degasification in this manner so that the light-emitting device is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are combined, the glare can be reduced and visibility of a displayed image can be increased.

The first electrode layer and the second electrode layer (also called a pixel electrode layer, a common electrode layer, a counter electrode layer, or the like) for applying voltage to the display apparatus each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a conductive material having a light-transmitting property such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof and a metal nitride thereof.

A conductive composition containing a conductive high molecule (also referred to as conductive polymer) can be used for the first electrode layer 4030 and the second electrode layer 4031. As the conductive high molecule, a so-called π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 18:
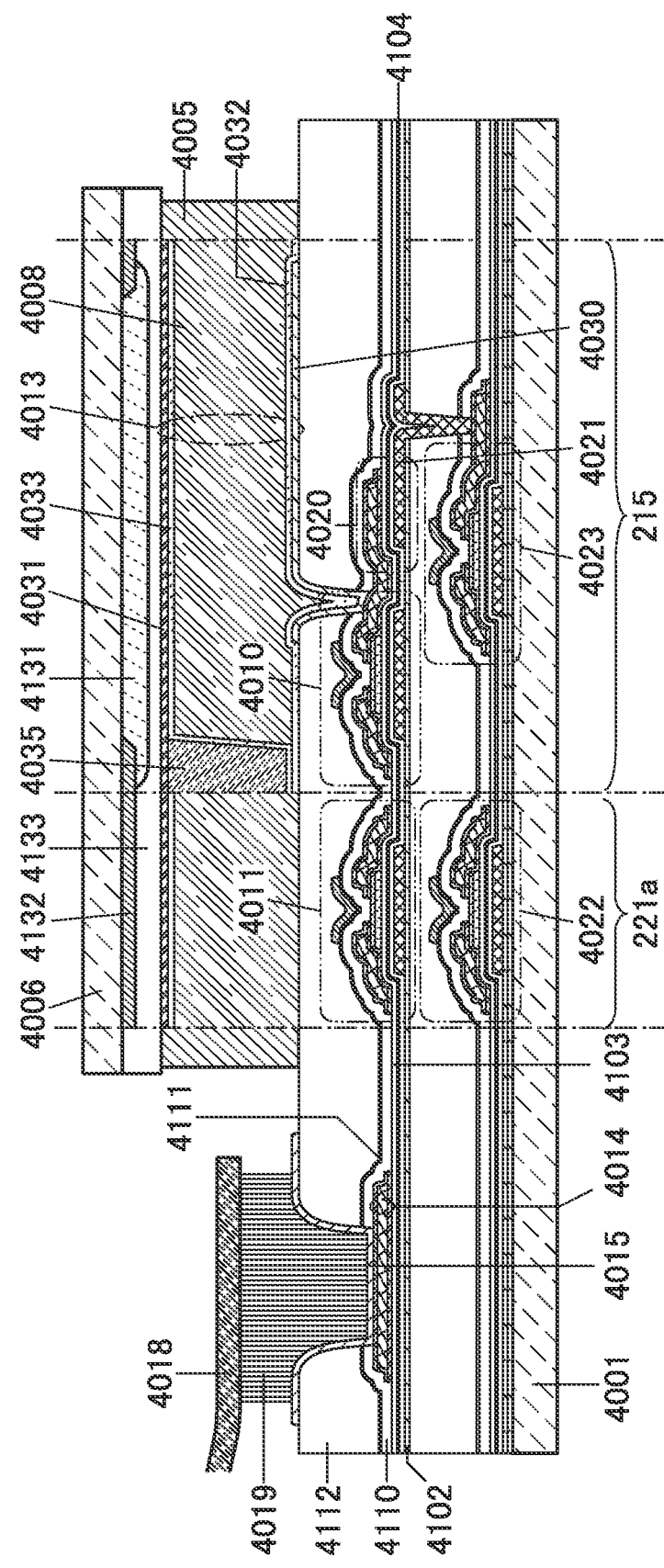
FIG. 18 is a diagram illustrating a display apparatus.

Note that as illustrated in FIG. 18, a stacked structure including a region where a transistor and a capacitor overlap with each other in the height direction may be employed. For example, when the transistor 4011 and a transistor 4022 included in the driver circuit are provided to overlap with each other, a display apparatus with a narrow frame can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display apparatus illustrated in FIG. 17A is illustrated in FIG. 18, the stacked structure may be employed for the EL display apparatus illustrated in FIG. 17B.

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display apparatus may have a structure with a combination of a liquid crystal display apparatus and a light-emitting apparatus.

The light-emitting apparatus is disposed on the side opposite to the display surface or on an end portion of the display surface. The light-emitting apparatus has a function of supplying light to the display device. The light-emitting apparatus can be also referred to as a backlight.

Here, the light-emitting apparatus can include a plate-like or sheet-like light guide portion (also referred to as a light guide plate) and a plurality of light-emitting devices which emit light of different colors. When the light-emitting devices are provided in the vicinity of the side surface of the light guide portion, light can be emitted from the side surface of the light guide portion to the inside. The light guide portion has a mechanism that changes an optical path (also referred to as a light extraction mechanism), and this enables the light-emitting apparatus to emit light uniformly to a pixel portion of a display panel. Alternatively, the light-emitting apparatus may be provided directly under the pixel without providing the light guide portion.

The light-emitting apparatus preferably includes light-emitting devices of three colors, red (R), green (G), and blue (B). In addition, a light-emitting device of white (W) may be included. A light emitting diode (LED) is preferably used as these light-emitting devices.

Furthermore, the light-emitting devices preferably have extremely high color purities; the full width at half maximum (FWHM) of the emission spectrum is less than or equal to 50 nm, preferably less than or equal to 40 nm, further preferably less than or equal to 30 nm, still further preferably less than or equal to 20 nm. Note that the full width at half maximum of the emission spectrum is preferably as small as possible, and can be, for example, greater than or equal to 1 nm. Thus, when a color image is displayed, a vivid image with high color reproducibility can be displayed.

As the red light-emitting device, an element whose wavelength of an emission spectrum peak is in a range from 625 nm to 650 nm is preferably used. As the green light-emitting device, an element whose wavelength of an emission spectrum peak is positioned in a range from 515 nm to 540 nm is preferably used. As the blue light-emitting device, an element whose wavelength of an emission spectrum peak is positioned in a range from 445 nm to 470 nm is preferably used.

The display apparatus can make the light-emitting devices of the three colors blink sequentially, drive the pixels in synchronization with these light-emitting elements, and display a color image on the basis of the successive additive color mixing method. This driving method can also be referred to as a field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

FIG. 19A and FIG. 19B each illustrate an example of a schematic cross-sectional view of a display apparatus capable of the field-sequential driving. A backlight unit capable of emitting light of RGB colors is provided on the first substrate 4001 side of the display apparatus. Note that in the field-sequential driving, the RGB colors are expressed through time division light emission, and thus color filters are not needed.

A backlight unit 4340a illustrated in FIG. 19A has a structure in which a plurality of light-emitting devices 4342 are provided directly under a pixel with a diffusing plate 4352 therebetween. The diffusing plate 4352 have functions of diffusing light emitted from the light-emitting device 4342 to the first substrate 4001 side and making the luminance in a display portion uniform. Between the light-emitting device 4342 and the diffusing plate 4352, a polarizing plate may be provided if necessary. The diffusing plate 4352 is not necessarily provided if not needed. The light-blocking layer 4132 may be omitted.

The backlight unit 4340a can include a large number of light-emitting devices 4342, which enables bright image display. Moreover, there are advantages that a light guide plate is not needed and light efficiency of the light-emitting device 4342 is less likely to be lowered. Note that the light-emitting device 4342 may be provided with a light diffusion lens 4344 if necessary.

A backlight unit 4340b illustrated in FIG. 19B has a structure in which a light guide plate 4341 is provided directly under a pixel with the diffusing plate 4352 therebetween. The plurality of light-emitting devices 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting device 4342 can be fixed to a printed circuit board 4347. Note that in FIG. 19B, the light-emitting devices 4342 of RGB colors overlap with each other; however, the light-emitting devices 4342 of RGB colors can be arranged to be lined up in the depth direction. A reflective layer 4348 that reflects visible light may be provided on the side surface of the light guide plate 4341 which is opposite to the light-emitting device 4342.

The backlight unit 4340b can reduce the number of light-emitting devices 4342, leading to reductions in cost and thickness.

A light-scattering liquid crystal device may be used as the liquid crystal device. As the light-scattering liquid crystal device, it is preferable to use an element containing a composite material of liquid crystal and a polymer molecule. For example, a polymer dispersed liquid crystal device can be used. Alternatively, a polymer network liquid crystal (PNLC) element may be used.

The light-scattering liquid crystal device has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. As the photocurable resin, it is possible to use a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal device performs display by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal device, a direction is generated at which a difference in a refractive index between the liquid crystal portion and the resin portion is small. Incident light along the direction passes without being scattered in the liquid crystal portion. Thus, the light-scattering liquid crystal device is perceived in a transparent state from the direction. By contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal device is in an opaque state regardless of the viewing direction.

FIG. 20A illustrates a structure in which the liquid crystal device 4013 of the display apparatus illustrated in FIG. 19A is replaced by a light-scattering liquid crystal device 4016.

The light-scattering liquid crystal device 4016 includes a composite layer 4009 including a liquid crystal portion and a resin portion, the first electrode layer 4030, and the second electrode layer 4031. Although components relating to the field-sequential driving are the same as those in FIG. 19A, when the light-scattering liquid crystal device 4016 is used, an alignment film and a polarizing plate are not necessary. Note that the spherical spacer 4035 is illustrated, but the spacer 4035 may have a columnar shape.

FIG. 20B illustrates a structure in which the liquid crystal device 4013 of the display apparatus in FIG. 19B is replaced by the light-scattering liquid crystal device 4016. In the structure of FIG. 19B, operation is preferably performed in a mode where light is transmitted when a voltage is not applied to the light-scattering liquid crystal device 4016 and light is scattered when a voltage is applied. With such a structure, the display apparatus can be transparent in a normal state (state in which no image is displayed). In that case, a color image can be displayed when a light scattering operation is performed.

FIG. 21A to FIG. 21E illustrate modification examples of the display apparatus illustrated in FIG. 20B. Note that in FIG. 21A to FIG. 21E, some components in FIG. are used and the other components are not illustrated for simplicity.

Figure 21A:
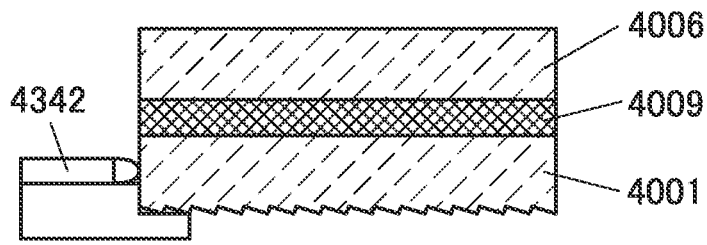
FIG. 21A to FIG. 21E are diagrams illustrating a display apparatus.

FIG. 21A illustrates a structure in which the first substrate 4001 has a function of a light guide plate. An uneven surface may be provided on an outer surface of the first substrate 4001. With this structure, a light guide plate does not need to be provided additionally, leading to a reduction in a manufacturing cost. Furthermore, the attenuation of light caused by the light guide plate also does not occur; accordingly, light emitted from the light-emitting device 4342 can be efficiently utilized.

Figure 21B:
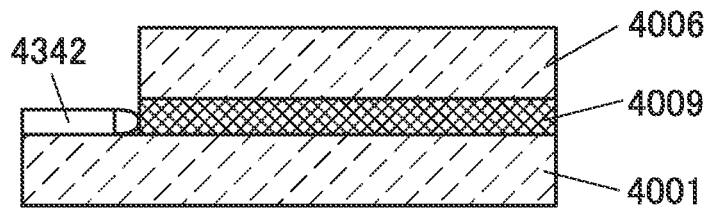

FIG. 21B illustrates a structure in which light enters from the vicinity of an end portion of the composite layer 4009. By utilizing total reflection at the interface between the composite layer 4009 and the second substrate 4006 and the interface between the composite layer 4009 and the first substrate 4001, light can be emitted to the outside from the light-scattering liquid crystal device. For the resin portion of the composite layer 4009, a material having a refractive index higher than that of the first substrate 4001 and that of the second substrate 4006 is used.

Figure 21C:
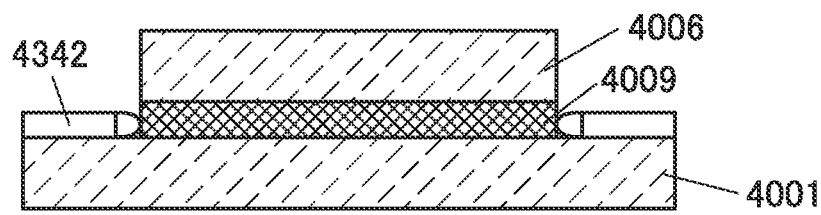

Note that the light-emitting device 4342 may be provided on one side of the display apparatus, or may be provided on each of two sides facing each other as illustrated in FIG. 21C. Furthermore, the light-emitting devices 4342 may be provided on three sides or four sides. When the light-emitting devices 4342 are provided on a plurality of sides, attenuation of light can be compensated for and application to a large-area display device is possible.

Figure 21D:
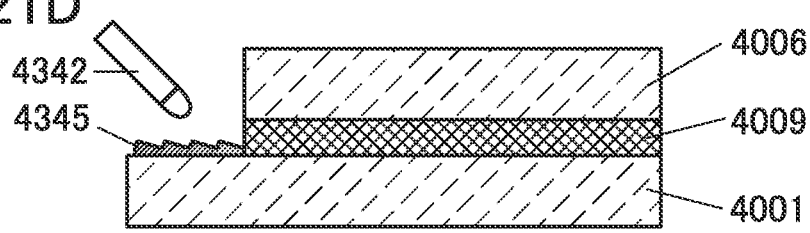

FIG. 21D illustrates a structure in which light emitted from the light-emitting device 4342 is guided to the display apparatus through a mirror 4345. With this structure, light can be guided easily with a certain angle to the display apparatus; thus, total reflection light can be obtained efficiently.

Figure 21E:
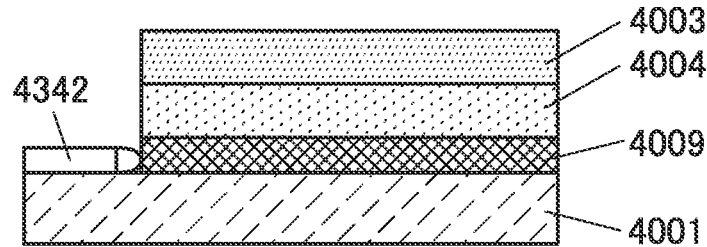

FIG. 21E illustrates a structure including a stack of a layer 4003 and a layer 4004 over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through the first interface without being totally reflected is totally reflected at the second interface and can be returned to the composite layer 4009. Accordingly, light emitted from the light-emitting device 4342 can be efficiently utilized.

Note that the structures in FIG. 20B and FIG. 21A to FIG. 21E can be combined with each other.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display apparatus of one embodiment of the present invention can be manufactured using a transistor with any of various structures, such as a bottom-gate transistor or a top-gate transistor. Therefore, a material used for a semiconductor layer or the structure of a transistor can be easily changed depending on the existing production line.

[Bottom-Gate Transistor]

FIG. 22A1 is a cross-sectional view of a channel-protective transistor 810, which is a type of bottom-gate transistor, in the channel length direction. In FIG. 22A1, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

The transistor 810 includes an insulating layer 741 over a channel formation region in the semiconductor layer 742. The transistor 810 also includes an electrode 744a and an electrode 744b which are over the insulating layer 726 and partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. Provision of the insulating layer 741 over the channel formation region can prevent exposure of the semiconductor layer 742 which is caused at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions (n+ regions). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 can reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region of the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 22A2 is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be equal to that of the gate electrode, or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. The electrode 723 may be provided between the insulating layer 728 and the insulating layer 729.

In the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 sandwiched therebetween and setting the potentials of the electrode 746 and the electrode 723 equal to each other, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

When the back gate electrode is formed using a conductive film having a light-blocking property, light can be prevented from entering the semiconductor layer from the back gate electrode side. Therefore, photodegradation of the semiconductor layer can be prevented, and degradation in electrical characteristics of the transistor, such as a shift of the threshold voltage, can be prevented.

According to one embodiment of the present invention, a transistor with favorable reliability can be provided. Moreover, a semiconductor device with favorable reliability can be provided.

FIG. 22B1 is a cross-sectional view of a channel-protective transistor 820, which has a structure different from that in FIG. 22A1, in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 22B2 is different from the transistor 820 in that the electrode 723 that can function as a back gate electrode is provided over the insulating layer 729.

Provision of the insulating layer 741 can prevent exposure of the semiconductor layer 742 which is caused at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced. According to one embodiment of the present invention, a transistor with favorable electrical characteristics can be provided.

FIG. 22C1 is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

A transistor 826 illustrated in FIG. 22C2 is different from the transistor 825 in that the electrode 723 that can function as a back gate electrode is provided over the insulating layer 729.

FIG. 23A1 to FIG. 23C2 are cross-sectional views of the transistors 810, 811, 820, 821, 825, and 826 in the channel width direction, respectively.

In each of the structures illustrated in FIG. 23B2 and FIG. 23C2, the gate electrode is connected to the back gate electrode, and the potentials of the gate electrode and the back gate electrode become equal to each other. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 24A1 is a type of top-gate transistor. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 which overlaps with the insulating layer 726 but does not overlap with the electrode 746.

A transistor 843 illustrated in FIG. 24A2 is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 24B1 and a transistor 845 shown in FIG. 24B2, the insulating layer 726 in a region that does not overlap with the electrode 746 may be completely removed. Alternatively, as in a transistor 846 shown in FIG. 24C1 and a transistor 847 illustrated in FIG. 24C2, the insulating layer 726 may be left. Also in the transistor 842 to the transistor 847, after the formation of the electrode 746, an impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIG. 25A1 to FIG. 25C2 illustrate cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

Examples of an electronic device that can use the display apparatus of one embodiment of the present invention include display devices, personal computers, image storage devices or image reproducing devices provided with storage media, cellular phones, game machines including portable game machines, portable data terminals, e-book readers, cameras such as video cameras and digital still cameras, goggles-type displays (head mounted displays), navigation systems, audio reproducing devices (e.g., car audio players and digital audio players), copiers, facsimiles, printers, multifunction printers, automated teller machines (ATM), and vending machines. FIG. 26 illustrates specific examples of such electronic devices.

Figure 26A:
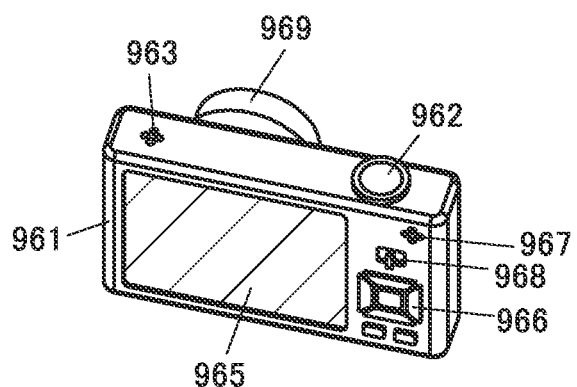
FIG. 26A to FIG. 26F are diagrams illustrating electronic devices.

FIG. 26A illustrates a digital camera, which includes a housing 961, a shutter button 962, a microphone 963, a speaker 967, a display portion 965, operation keys 966, a zoom lever 968, a lens 969, and the like. With the use of the display apparatus of one embodiment of the present invention for the display portion 965, a variety of images can be displayed.

Figure 26B:
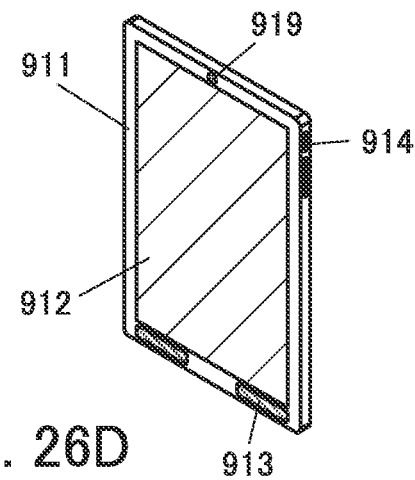

FIG. 26B illustrates a portable data terminal, which includes a housing 911, a display portion 912, speakers 913, an operation button 914, a camera 919, and the like. A touch panel function included in the display portion 912 enables input and output of information. With the use of the display apparatus of one embodiment of the present invention for the display portion 912, a variety of images can be displayed.

Figure 26C:
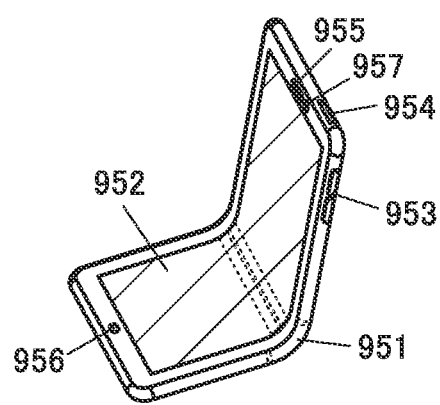

FIG. 26C illustrates a cellular phone, which includes a housing 951, a display portion 952, an operation button 953, an external connection port 954, a speaker 955, a microphone 956, a camera 957, and the like. The display portion 952 of the cellular phone includes a touch sensor. Operations such as making a call and inputting text can be performed by touch on the display portion 952 with a finger, a stylus, or the like. The housing 901 and the display portion 952 have flexibility and can be used in a bent state as illustrated in the figure. With the use of the display apparatus of one embodiment of the present invention for the display portion 952, a variety of images can be displayed.

Figure 26D:
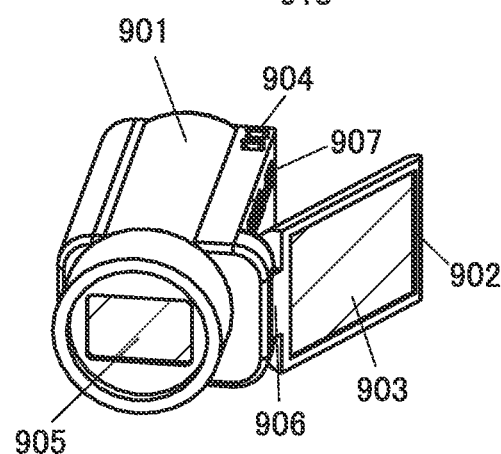

FIG. 26D illustrates a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. With the use of the display apparatus of one embodiment of the present invention for the display portion 903, a variety of images can be displayed.

Figure 26E:
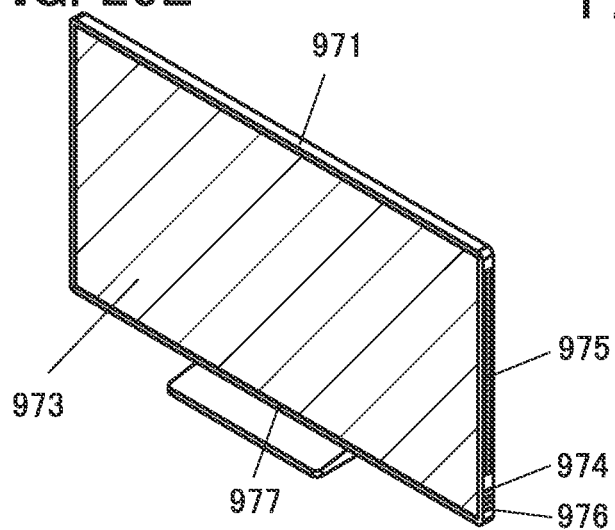

FIG. 26E illustrates a television, which includes a housing 971, a display portion 973, an operation button 974, speakers 975, a communication connection terminal 976, an optical sensor 977, and the like. The display portion 973 includes a touch sensor that enables an input operation. With the use of the display apparatus of one embodiment of the present invention for the display portion 973, a variety of images can be displayed.

Figure 26F:
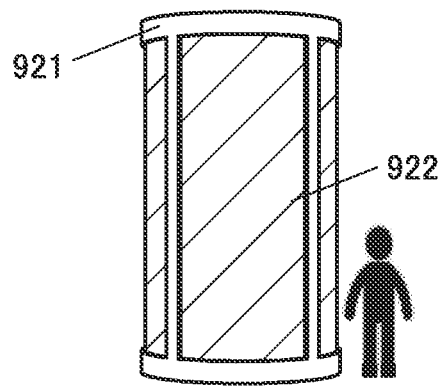

FIG. 26F illustrates digital signage, which has a large display portion 922. The large display portion 922 in the digital signage is attached to a side surface of a pillar 921, for example. With the use of the display apparatus of one embodiment of the present invention for the display portion 922, display with high display quality can be performed.

This embodiment can be implemented in combination with any of the structures described in the other embodiments as appropriate.

REFERENCE NUMERALS

10: pixel, 11: source driver, 12: gate driver, 13: circuit, 14: circuit, 15: circuit, 16: selection circuit, 17: selection circuit, 18: pixel array, 21: circuit, 25*a*: output terminal, output terminal, 25*c*: output terminal, 101: transistor, 102: transistor, 103: transistor, 104: transistor, 105: transistor, 106: capacitor, 107: transistor, 108: capacitor, 109: transistor, 110: transistor, 111: capacitor, 112: transistor, 113: transistor, 114: capacitor, 115: capacitor, 116: transistor, 117: transistor, 118: capacitor, 119: transistor, 121: wiring, 122: wiring, 123: wiring, 124: wiring, 125: wiring, 126: wiring, 127: wiring, 128: wiring, 141: capacitor, 142: liquid crystal device, 143: transistor, 144: transistor, 145: transistor, 146: capacitor, 147: light-emitting device, 148: transistor, 149: transistor, 151: wiring, 152: wiring, 153: wiring, 154: wiring, 155: wiring, 156: wiring, 170: circuit, 171: circuit, 215: display portion, 221*a*: scan line driver circuit, 231*a*: signal line driver circuit, 232*a*: signal line driver circuit, 241*a*: common line driver circuit, 723: electrode, 726: insulating layer, 728: insulating layer, 729: insulating layer, 741: insulating layer, 742: semiconductor layer, 744*a*: electrode, 744*b*: electrode, 746: electrode, 771: substrate, 772: insulating layer, 810: transistor, 811: transistor, 820: transistor, 821: transistor, 825: transistor, 826: transistor, 842: transistor, 843: transistor, 844: transistor, 845: transistor, 846: transistor, 847: transistor, 901: housing, 902: housing, 903: display portion, 904: operation key, 905: lens, 906: connection portion, 907: speaker, 911: housing, 912: display portion, 913: speaker, 914: operation button, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4003: layer, 4004: layer, 4005: sealant, 4006: substrate, 4008: liquid crystal layer, 4009: composite layer, 4010: transistor, 4011: transistor, 4013: liquid crystal device, 4014: wiring, 4015: electrode, 4016: light-scattering liquid crystal device, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input device, 4210: touch panel, 4227: electrode, 4228: electrode, 4237: wiring, 4238: wiring, 4239: wiring, 4263: substrate, 4272*b*: FPC, 4273*b*: IC, 4340*a*: backlight unit, 4340*b*: backlight unit, 4341: light guide plate, 4342: light-emitting device, 4344: lens, 4345: mirror, 4347: printed circuit board, 4348: reflective layer, 4352: diffusing plate, 4510: partition wall, 4511: light-emitting layer, 4513: light-emitting device, 4514: filler

The invention claimed is:

1. A display apparatus comprising:
   a shift register;
   a boosting circuit; and
   a pixel,
   wherein the shift register comprises a first output terminal, a second output terminal, and a third output terminal,
   wherein the boosting circuit comprises a first transistor, a second transistor, and a first capacitor,
   wherein the pixel comprises a third transistor,
   wherein one of a source and a drain of the first transistor is electrically connected to one electrode of the first capacitor,
   wherein the one electrode of the first capacitor is electrically connected to one of a source and a drain of the second transistor,
   wherein the one electrode of the first capacitor is electrically connected to a gate of the third transistor,
   wherein the one of the source and the drain of the first transistor, the one electrode of the first capacitor, and the one of the source and the drain of the second transistor are electrically connected to one another,
   wherein a gate of the first transistor is electrically connected to the first output terminal,
   wherein the other electrode of the first capacitor is electrically connected to the second output terminal, and
   wherein a gate of the second transistor is electrically connected to the third output terminal.

2. The display apparatus according to claim 1,
   wherein the pixel comprises a display element, and wherein the pixel is configured to generate third data on the basis of first data and second data and configured to perform display using the display element in accordance with the third data.

3. The display apparatus according to claim 2, wherein the display element is a liquid crystal device.

4. The display apparatus according to claim 1, wherein the first transistor, the second transistor, and the third transistor each has a metal oxide in a channel formation region, and the metal oxide comprises In, Zn, and M (M is Al, Ti, Ga, Ge, Sn, Y, Zr, La, Ce, Nd, or Hf).

5. The display apparatus according to claim 1, wherein the shift register outputs a signal voltage to the first output terminal, the second output terminal, and the third output terminal in this order.

6. A display apparatus comprising:
a shift register;
a boosting circuit; and
a pixel,
wherein the shift register comprises a first output terminal, a second output terminal, a third output terminal, a fourth output terminal, and a fifth output terminal,
wherein the boosting circuit comprises a first transistor, a second transistor, a third transistor, a fourth transistor, a fifth transistor, a sixth transistor, a first capacitor, a second capacitor, and a third capacitor,
wherein the pixel comprises a seventh transistor,
wherein one of a source and a drain of the first transistor is electrically connected to one electrode of the first capacitor,
wherein the other electrode of the first capacitor is electrically connected to one of a source and a drain of the second transistor,
wherein one of a source and a drain of the third transistor is electrically connected to the one of the source and the drain of the first transistor and a gate of the seventh transistor,
wherein the one of the source and the drain of the second transistor is electrically connected to one of a source and a drain of the fourth transistor and one electrode of the second capacitor,
wherein the other electrode of the second capacitor is electrically connected to one of a source and a drain of the sixth transistor,
wherein the one of the source and the drain of the sixth transistor is electrically connected to one of a source and a drain of the fifth transistor and one electrode of the third capacitor,
wherein a gate of the first transistor and a gate of the second transistor are electrically connected to the first output terminal,
wherein a gate of the fourth transistor and a gate of the sixth transistor are electrically connected to the second output terminal,
wherein a gate of the fifth transistor is electrically connected to the third output terminal,
wherein one electrode of the third capacitor is electrically connected to the fourth output terminal, and
wherein the gate of the third transistor is electrically connected to the fifth output terminal.

7. The display apparatus according to claim 6,
wherein the pixel comprises a display element, and
wherein the pixel is configured to generate third data on the basis of first data and second data and configured to perform display using the display element in accordance with the third data.

8. The display apparatus according to claim 7, wherein the display element is a liquid crystal device.

9. The display apparatus according to claim 6, wherein the first transistor, the second transistor, and the seventh transistor each has a metal oxide in a channel formation region, and the metal oxide comprises In, Zn, and M (M is Al, Ti, Ga, Ge, Sn, Y, Zr, La, Ce, Nd, or Hf).

10. The display apparatus according to claim 6, wherein the shift register outputs a signal voltage to the first output terminal, the second output terminal, the third output terminal, the fourth output terminal, and the fifth output terminal in this order.

* * * * *